US 12,477,926 B2

(12) United States Patent
Kim et al.

(10) Patent No.: US 12,477,926 B2
(45) Date of Patent: *Nov. 18, 2025

(54) DISPLAY DEVICE

(71) Applicant: Samsung Display Co., Ltd., Yongin-si (KR)

(72) Inventors: Eunyoung Kim, Asan-si (KR); Wonkyu Kwak, Seongnam-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/765,143

(22) Filed: Jul. 5, 2024

(65) Prior Publication Data

US 2024/0365637 A1    Oct. 31, 2024

Related U.S. Application Data

(63) Continuation of application No. 17/901,729, filed on Sep. 1, 2022, now Pat. No. 12,035,601.

(30) Foreign Application Priority Data

Nov. 12, 2021    (KR) .................... 10-2021-0155962

(51) Int. Cl.
*H10K 59/40*   (2023.01)
*G06F 3/044*   (2006.01)
(Continued)

(52) U.S. Cl.
CPC ........... *H10K 59/40* (2023.02); *G06F 3/0446* (2019.05); *H10K 59/122* (2023.02); *H10K 59/131* (2023.02)

(58) Field of Classification Search
CPC .... H10K 59/40; H10K 59/122; H10K 59/131; H10K 59/8723; H10K 59/873; H10K 59/124; G06F 3/0446; G06F 3/041; G06F 3/0412; G06F 3/04164; G06F 3/0443; G06F 3/0418; H10D 86/441; H10D 86/60
See application file for complete search history.

(56) References Cited

U.S. PATENT DOCUMENTS 9,508,778 B2    11/2016   Kim et al.
10,224,383 B2    3/2019   Park et al.
(Continued)

FOREIGN PATENT DOCUMENTS

KR    10-2017-0023268 A    3/2017
KR    10-1786446 B1    10/2017
(Continued)

*Primary Examiner* — Amy Onyekaba
(74) *Attorney, Agent, or Firm* — Womble Bond Dickinson (US) LLP

(57) ABSTRACT

Provided is a display device including a display panel partitioned into a display region and a non-display region, and an input sensing unit including a sensing pad in a pad region overlapping the non-display region, a sensing electrode overlapping the display region, and a signal line electrically connecting the sensing pad and the sensing electrode, wherein the display panel has a spacer overlapping the non-display region, and defining an opening in which a first portion of the signal line is located, the first portion of the signal line having a greater width than a second portion adjacent thereto.

16 Claims, 12 Drawing Sheets

(51) Int. Cl.
    *H10K 59/122*     (2023.01)
    *H10K 59/131*     (2023.01)

(56)     References Cited

U.S. PATENT DOCUMENTS

| | | | |
|---|---|---|---|
| 11,183,667 | B2 | 11/2021 | Bang et al. |
| 2017/0345847 | A1* | 11/2017 | Kim ............... H10B 63/22 |
| 2018/0013092 | A1* | 1/2018 | Park .............. H10K 59/121 |
| 2018/0033832 | A1* | 2/2018 | Park .............. G06F 3/0446 |
| 2018/0090517 | A1* | 3/2018 | Park ............. H10K 50/8426 |
| 2018/0308903 | A1* | 10/2018 | Jeong ............ H10K 59/40 |
| 2019/0006442 | A1* | 1/2019 | Byun ............. H10K 59/131 |
| 2019/0074328 | A1 | 3/2019 | Park |
| 2019/0173048 | A1* | 6/2019 | Sung ............. G09G 3/3233 |
| 2019/0245161 | A1* | 8/2019 | Lee ............. H10K 59/8723 |
| 2019/0326375 | A1* | 10/2019 | Ochi ............. H05B 33/04 |
| 2020/0083306 | A1* | 3/2020 | Choi ............ H10K 59/8731 |
| 2020/0091256 | A1* | 3/2020 | Kim .............. H10K 59/87 |
| 2020/0127220 | A1* | 4/2020 | Kim ............ H10K 59/8731 |
| 2020/0129100 | A1 | 4/2020 | Li et al. |
| 2020/0152727 | A1* | 5/2020 | Shin ............. H10K 50/844 |
| 2020/0168685 | A1* | 5/2020 | Bang ............. G06F 3/0412 |
| 2020/0185647 | A1* | 6/2020 | Lee ............ H10K 59/8722 |
| 2020/0381653 | A1* | 12/2020 | Bang ............. H10K 50/844 |
| 2021/0036064 | A1 | 2/2021 | Jang et al. |
| 2021/0066419 | A1* | 3/2021 | Byun ............ H10K 50/844 |
| 2021/0066642 | A1* | 3/2021 | Lee ............. H10K 59/124 |
| 2021/0134928 | A1* | 5/2021 | Bang ............ H10K 59/131 |
| 2021/0165517 | A1 | 6/2021 | Lee et al. |
| 2021/0175470 | A1* | 6/2021 | Kang ............ H10K 50/844 |
| 2021/0296423 | A1* | 9/2021 | Jung ............. H10K 59/40 |
| 2022/0140054 | A1* | 5/2022 | Youn ........... H10K 59/8731 |
| | | | 257/40 |
| 2022/0344447 | A1* | 10/2022 | Lee ............ H10K 59/1213 |
| 2022/0384533 | A1 | 12/2022 | Jang et al. |
| 2022/0415971 | A1* | 12/2022 | Zhao ............ H10K 59/131 |
| 2023/0011418 | A1* | 1/2023 | Long ............. H10K 59/873 |
| 2023/0194933 | A1 | 6/2023 | Shiina |
| 2023/0255076 | A1* | 8/2023 | Okabe ............ H05B 33/22 |
| | | | 257/40 |
| 2024/0224718 | A1* | 7/2024 | Wang ............ H10K 59/122 |

FOREIGN PATENT DOCUMENTS

| | | |
|---|---|---|
| KR | 10-2021-0046104 A | 4/2021 |
| KR | 10-2021-0066373 A | 6/2021 |

* cited by examiner

DISPLAY DEVICE

CROSS-REFERENCE TO RELATED APPLICATIONS

This application is a continuation of U.S. patent application Ser. No. 17/901,729, filed Sep. 1, 2022, which claims priority to and the benefit of Korean Patent Application No. 10-2021-0155962, filed Nov. 12, 2021, the entire content of both of which is incorporated herein by reference.

BACKGROUND

The present disclosure herein relates to a display device having a signal transmission region through which an optical signal is transferred, and an electronic device including the same.

A display device may include a display panel that displays an image, and an input sensing unit that senses an external input. The input sensing unit may be integrally formed with the display panel through a continuous process. Alternatively, the input sensing unit may be formed through a process that is separate from the display panel, and then may be bonded to the display panel.

A spacer is included in the display panel to reduce or prevent overflow of an organic layer, and to reduce or prevent dents in a metal mask. The spacer may be located along the periphery of a display region of the display panel to provide a reference plane on which the metal mask is placed in a subsequent process.

SUMMARY

The present disclosure provides a display device with improved reliability capable of reducing or preventing defects, such as a short circuit, caused by a reduction in the thickness of a signal line included in an input sensing unit.

One or more embodiments of the present disclosure provides a display device including a display panel partitioned into a display region and a non-display region, and an input sensing unit including a sensing pad in a pad region overlapping the non-display region, a sensing electrode overlapping the display region, and a signal line electrically connecting the sensing pad and the sensing electrode, wherein the display panel has a spacer overlapping the non-display region, and defining an opening in which a first portion of the signal line is located, the first portion of the signal line having a greater width than a second portion adjacent thereto.

The spacer might not overlap the signal line.

The signal line may include sub-signal lines in the opening, wherein the spacer includes sub-spacers respectively between the sub-signal lines.

The display panel may include a base layer, a circuit layer on the base layer, and including insulating layers, and a light-emitting element layer on the circuit layer, and including a pixel defining film and a light-emitting element, wherein the spacer is on the pixel defining film.

A portion of the insulating layers that overlaps the first portion of the signal line may be thinner than another portion of insulating layers that does not overlap the first portion of the signal line.

The display panel may further include a dam in the non-display region and including a stack of materials that are respectively the same as at least one of the insulating layers, the pixel defining film, and the spacer.

The dam may include a first dam, and a second dam that is closer to the display region than the first dam.

The pixel defining film might not overlap the first portion of the signal line.

The dam may include a first layer including a same material as the at least one of the insulating layers, a second layer including a same material as the pixel defining film, and a third layer including a same material as the spacer.

The input sensing unit may include a first sensing insulating layer directly on the display panel, a first conductive layer on the first sensing insulating layer, a second sensing insulating layer on the first conductive layer, a second conductive layer on the second sensing insulating layer, and a third sensing insulating layer on the second conductive layer.

The signal line may include a first signal line on the first sensing insulating layer, and a second signal line on the second sensing insulating layer.

The second signal line may overlap the first portion of the signal line, and the first signal line does not overlap the first portion of the signal line.

The first signal line may include a (1-1)-st signal line having one end connected to the sensing electrode, and connected to the second signal line through a first contact hole, and a (1-2)-nd signal line having one end connected to the sensing pad, and connected to the second signal line through a second contact hole.

The spacer may at least partially surround the display region in a plan view.

One or more embodiments of the present disclosure provides a display device including a display panel partitioned into a display region and a non-display region, and an input sensing unit including a sensing pad in a pad region overlapping the non-display region, a sensing electrode overlapping the display region, and a signal line electrically connecting the sensing pad and the sensing electrode, wherein the display panel includes a dam overlapping the non-display region, at least partially surrounding the display region in a plan view, and having a first portion overlapping the signal line, and a second portion not overlapping the signal line, wherein a height of the first portion is less than a height of the second portion, and wherein a first line portion of the signal line overlapping the first portion has a greater width than a second line portion adjacent thereto.

The display panel may include a base layer, a circuit layer on the base layer, and including insulating layers, and a light-emitting element layer on the circuit layer, and including a pixel defining film and a light-emitting element, and a spacer on the pixel defining film.

The dam may include sequentially stacked layers including a first layer including a same material as at least one of the insulating layers, a second layer including a same material as the pixel defining film, and a third layer including a same material as the spacer.

The third layer might not overlap the first portion, and may overlap the second portion.

The dam may at least partially surround the display region in plan view.

One or more embodiments of the present disclosure provides a display device including a display panel partitioned into a display region and a non-display region, and an input sensing unit including a sensing pad in a pad region overlapping the non-display region, a sensing electrode overlapping the display region, a first sensing insulating layer directly on the display panel, a second sensing insulating layer on the first sensing insulating layer, and a signal line configured to connect the sensing pad and the sensing electrode, and including a first signal line on the first sensing insulating layer, and a second signal line on the second sensing insulating layer, wherein the display panel includes a spacer overlapping the non-display region, and defining an opening in which the second signal line is located, and in which the first signal line is not located.

BRIEF DESCRIPTION OF THE FIGURES

The accompanying drawings are included to provide a further understanding of the present disclosure, and are incorporated in, and constitute a part of, this specification. The drawings illustrate embodiments of the present disclosure and, together with the description, serve to explain aspects of the present disclosure. In the drawings.

DETAILED DESCRIPTION

Figure 1A:
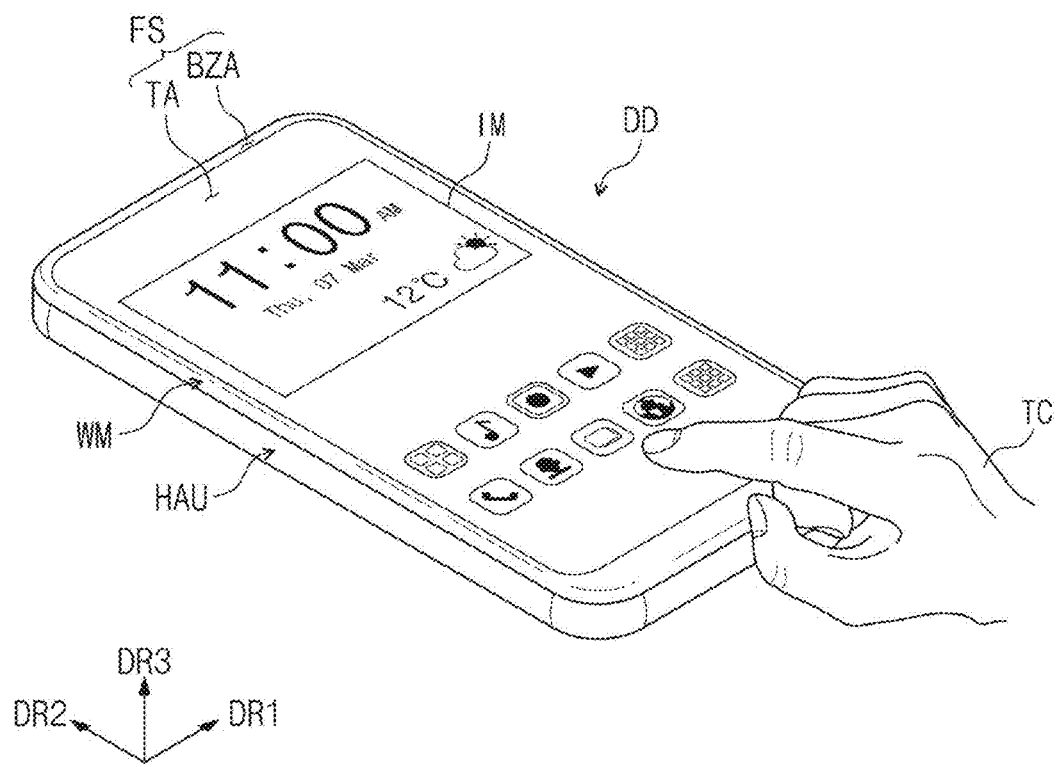
FIG. 1A is a combined perspective view of a display device according to one or more embodiments of the present disclosure.

Aspects of some embodiments of the present disclosure and methods of accomplishing the same may be understood more readily by reference to the detailed description of embodiments and the accompanying drawings. Hereinafter, embodiments will be described in more detail with reference to the accompanying drawings. The described embodiments, however, may have various modifications and may be embodied in various different forms, and should not be construed as being limited to only the illustrated embodiments herein. Rather, these embodiments are provided as examples so that this disclosure will be thorough and complete, and will fully convey the aspects of the present disclosure to those skilled in the art, and it should be understood that the present disclosure covers all the modifications, equivalents, and replacements within the idea and technical scope of the present disclosure. Accordingly, processes, elements, and techniques that are not necessary to those having ordinary skill in the art for a complete understanding of the aspects of the present disclosure may not be described.

Unless otherwise noted, like reference numerals, characters, or combinations thereof denote like elements throughout the attached drawings and the written description, and thus, descriptions thereof will not be repeated. Further, parts that are not related to, or that are irrelevant to, the description of the embodiments might not be shown to make the description clear.

In the drawings, the relative sizes of elements, layers, and regions may be exaggerated for clarity. Additionally, the use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Further, specific structural or functional descriptions disclosed herein are merely illustrative for the purpose of describing embodiments according to the concept of the present disclosure. Thus, embodiments disclosed herein should not be construed as limited to the particular illustrated shapes of regions, but are to include deviations in shapes that result from, for instance, manufacturing.

For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place.

Thus, the regions illustrated in the drawings are schematic in nature and their shapes are not intended to illustrate the actual shape of a region of a device and are not intended to be limiting. Additionally, as those skilled in the art would realize, the described embodiments may be modified in various different ways, all without departing from the spirit or scope of the present disclosure.

In the detailed description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form in order to avoid unnecessarily obscuring various embodiments.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. Similarly, when a first part is described as being arranged "on" a second part, this indicates that the first part is arranged at an upper side or a lower side of the second part without the limitation to the upper side thereof on the basis of the gravity direction.

Further, in this specification, the phrase "on a plane," or "plan view," means viewing a target portion from the top, and the phrase "on a cross-section" means viewing a cross-section formed by vertically cutting a target portion from the side.

It will be understood that when an element, layer, region, or component is referred to as being "formed on," "on," "connected to," or "coupled to" another element, layer, region, or component, it can be directly formed on, on, connected to, or coupled to the other element, layer, region, or component, or indirectly formed on, on, connected to, or coupled to the other element, layer, region, or component such that one or more intervening elements, layers, regions, or components may be present. In addition, this may collectively mean a direct or indirect coupling or connection and an integral or non-integral coupling or connection. For example, when a layer, region, or component is referred to as being "electrically connected" or "electrically coupled" to another layer, region, or component, it can be directly electrically connected or coupled to the other layer, region, and/or component or intervening layers, regions, or components may be present. However, "directly connected/directly coupled," or "directly on," refers to one component directly connecting or coupling another component, or being on another component, without an intermediate component. Meanwhile, other expressions describing relationships between components such as "between," "immediately between" or "adjacent to" and "directly adjacent to" may be construed similarly. In addition, it will also be understood that when an element or layer is referred to as being "between" two elements or layers, it can be the only element or layer between the two elements or layers, or one or more intervening elements or layers may also be present.

For the purposes of this disclosure, expressions such as "at least one of," when preceding a list of elements, modify the entire list of elements and do not modify the individual elements of the list. For example, "at least one of X, Y, and Z," "at least one of X, Y, or Z," and "at least one selected from the group consisting of X, Y, and Z" may be construed as X only, Y only, Z only, any combination of two or more of X, Y, and Z, such as, for instance, XYZ, XYY, YZ, and ZZ, or any variation thereof. Similarly, the expression such as "at least one of A and B" may include A, B, or A and B. As used herein, "or" generally means "and/or," and the term "and/or" includes any and all combinations of one or more of the associated listed items. For example, the expression such as "A and/or B" may include A, B, or A and B.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure. The description of an element as a "first" element may not require or imply the presence of a second element or other elements. The terms "first", "second", etc. may also be used herein to differentiate different categories or sets of elements. For conciseness, the terms "first", "second", etc. may represent "first-category (or first-set)", "second-category (or second-set)", etc., respectively.

In the examples, the x-axis, the y-axis, and/or the z-axis are not limited to three axes of a rectangular coordinate system, and may be interpreted in a broader sense. For example, the x-axis, the y-axis, and the z-axis may be perpendicular to one another, or may represent different directions that are not perpendicular to one another. The same applies for first, second, and/or third directions.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof.

When one or more embodiments may be implemented differently, a specific process order may be performed differently from the described order. For example, two consecutively described processes may be performed substantially at the same time or performed in an order opposite to the described order.

As used herein, the term "substantially," "about," "approximately," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value. Further, the use of "may" when describing embodiments of the present disclosure refers to "one or more embodiments of the present disclosure."

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, a display device according to one or more embodiments of the present disclosure will be described with reference to the accompanying drawings.

Figure 1B:
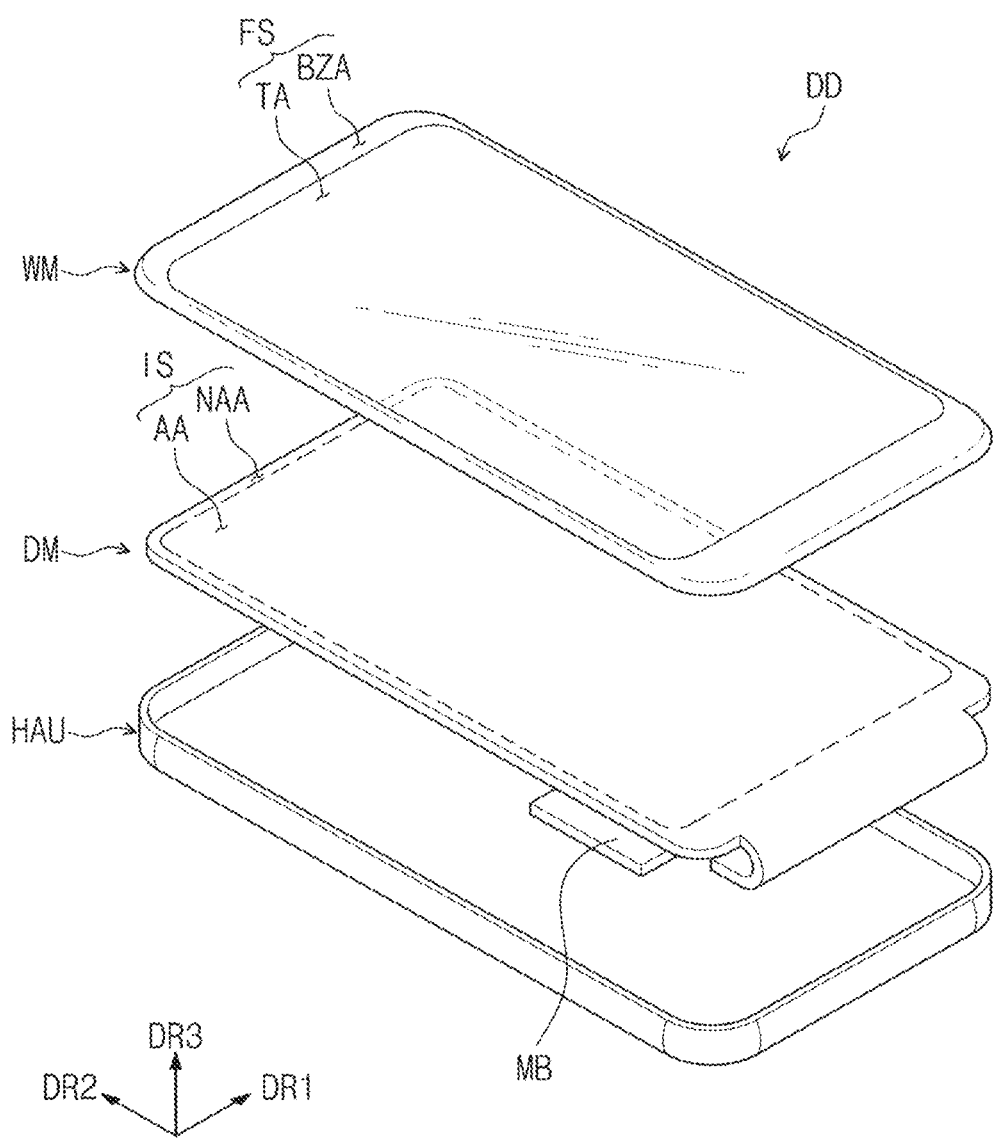
FIG. 1B is an exploded perspective view of a display device according to one or more embodiments of the present disclosure.

FIG. 1A is a combined perspective view of a display device according to one or more embodiments of the present disclosure. FIG. 1B is an exploded perspective view of a display device according to one or more embodiments of the present disclosure. Embodiments of the present disclosure will be described with reference to FIGS. 1A and 1B.

A display device DD may be a device activated in response to an electrical signal. The display device DD may display an image IM, and may sense an external input TC. The display device DD may include various embodiments.

For example, the display device DD may include a tablet computer, a laptop, a computer, a smart television, and the like. In one or more embodiments, the display device DD is illustrated as a smart phone.

The display device DD may display the image IM in a third direction DR3 on a display surface FS that is substantially parallel to each of a first direction DR1 and a second direction DR2. The display surface FS on which the image IM is displayed may correspond to a front surface of the display device DD, and may correspond to a front surface FS of a window member WM. Hereinafter, the same reference numerals or symbols are used for the display surface, the front surface of the display device DD, and the front surface of the window member WM. The image IM may include a still image and/or a dynamic image. As an example of the image IM in FIG. 1A, a clock and a plurality of icons are illustrated.

In one or more embodiments, the front surface (or upper surface) and the rear surface (or lower surface) of each member are defined based on the direction in which the image IM is displayed. The front surface and the rear surface may be opposed to each other with respect to the third direction DR3, and a normal direction of each of the front surface and the rear surface may be substantially parallel to the third direction DR3. The separation distance between the front surface and the rear surface in the third direction DR3 may correspond to the thickness of the display panel DP in the third direction DR3. Meanwhile, the directions indicated by the first to third directions DR1, DR2, and DR3 are relative concepts, and may be changed into other directions. Hereinafter, the first to third directions refer to the same reference numerals as directions respectively indicated by the first to third directions DR1, DR2, and DR3.

Alternatively, for example, the display device DD according to one or more embodiments may sense a user's input TC applied from the outside. The user's input TC may include various types of external inputs, such as a portion of the user's body, light, heat, or pressure. In one or more embodiments, the user's input TC is illustrated as a user's hand applied to the front surface. However, this is illustrated by way of example, and as described above, the user's input TC may be provided in various forms. In addition, the display device DD may sense the user's input TC applied to the side surface or rear surface of the display device DD according to the structure of the display device DD, and the present disclosure is not limited to any one embodiment.

As illustrated in FIGS. 1A and 1B, the display device DD includes a window member WM, a display module DM, and an outer case HAU. In one or more embodiments, the window member WM and the outer case HAU are bonded to form an exterior of the display device DD. In one or more embodiments, the outer case HAU, the display module DM, and the window member WM may be sequentially stacked along the third direction DR3.

The window member WM may include an insulating panel. For example, the window member WM may be made of glass, plastic, or a combination thereof.

As described above, the front surface FS of the window member WM defines the front surface of the display device DD. A transmission region TA may be an optically transparent region. For example, the transmission region TA may be a region having a visible light transmittance of about 90% or more.

A bezel region BZA may be a region having relatively lower light transmittance than the transmission region TA. The bezel region BZA defines the shape of the transmission region TA. The bezel region BZA may be adjacent to the transmission region TA, and may surround the transmission region TA.

The bezel region BZA may have a color (e.g., predetermined color). The bezel region BZA may cover the peripheral region NAA of the display module DM to block a peripheral region NAA from being viewed from the outside. Meanwhile, this is illustrated by way of example, and in the window member WM according to one or more embodiments of the present disclosure, the bezel region BZA may be omitted.

The display module DM may display an image IM, and may sense an external input TC. The image IM may be displayed on a front surface IS of the display module DM. The front surface IS of the display module DM includes an active region AA and the peripheral region NAA. The active region AA may be a region activated in response to an electrical signal.

In one or more embodiments, the active region AA may be a region in which the image IM is displayed, and may also be a region in which the external input TC is sensed. The transmission region TA overlaps at least the active region AA. For example, the transmission region TA overlaps a front surface or at least a portion of the active region AA. Accordingly, the user may view the image IM through the transmission region TA, or may provide an external input TC. However, this is illustrated by way of example, and a region in which the image IM is displayed and a region in which the external input TC is sensed may be separated from each other in the active region AA, and the present disclosure is not limited to any one embodiment.

The peripheral region NAA may be a region covered by the bezel region BZA. The peripheral region NAA is adjacent to the active region AA. The peripheral region NAA may surround the active region AA. A driving circuit, a driving wire, or the like for driving the active region AA may be located in the peripheral region NAA.

The display module DM may include a display panel and an input sensing unit. The image IM may be substantially displayed on the display panel, and the external input TC may be substantially sensed by the input sensing unit. Because the display module DM includes both the display panel and the input sensing unit, the display module DM may not only display the image IM, but also may sense the external input TC. A detailed description thereof will be made later.

At least a portion of the display module DM may be bent. In one or more embodiments, a portion of the display module DM to which a circuit board MB is connected is bent toward the rear surface of the display module DM, so that the circuit board MB may be assembled to overlap the rear surface of the display module DM. The circuit board MB is bonded to one side of the display module DM to be physically and electrically connected to the display module DM. The circuit board MB may generate an electrical signal to be provided to the display module DM, or may receive a signal generated by the display module DM, and may calculate the signal as a result value including information on the sensed position or intensity of the external input TC.

The outer case HAU is bonded to the window member WM to define an exterior of the display device DD. The outer case HAU provides an inner space (e.g., a predetermined inner space). The display module DM may be accommodated in the inner space.

The outer case HAU may include a material having a relatively high rigidity. For example, the outer case HAU may include a plurality of frames and/or plates made of glass, plastic, metal, or a combination thereof. The external case HAU may stably protect the components of the display device DD accommodated in the inner space from external impact.

Figure 2:
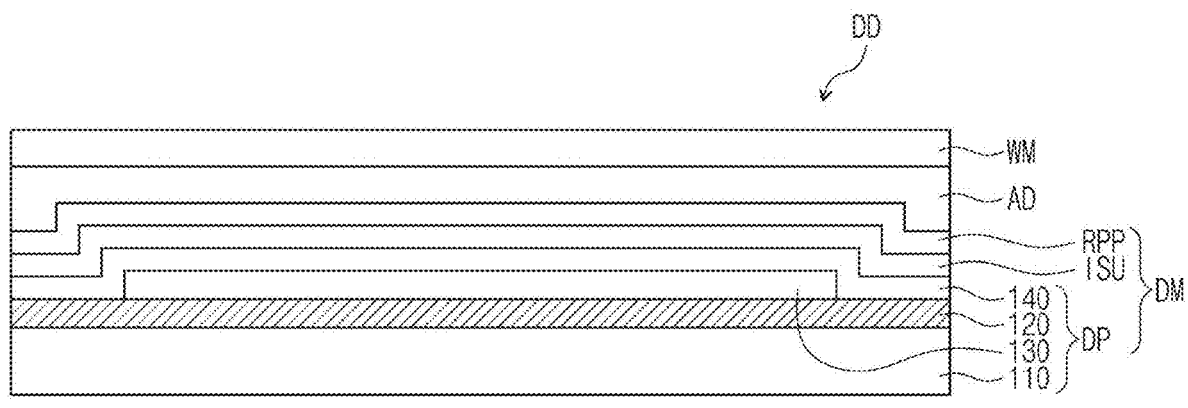
FIG. 2 is a cross-sectional view of a display device according to one or more embodiments of the present disclosure.
Figure 2:
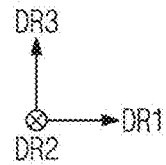

FIG. 2 is a cross-sectional view of a display device according to one or more embodiments of the present disclosure. Referring to FIG. 2, the display device DD may include a display panel DP, an input sensing unit ISU, an anti-reflection member RPP (anti-reflector), and a window member WM.

The display panel DP may be a light-emitting display panel, and for example, the display panel DP may include an organic light-emitting display panel, an inorganic light-emitting display panel, a micro LED display panel, or a nano LED display panel. The display panel DP may include a base layer 110, a circuit layer 120, a light-emitting element layer 130, and an encapsulation layer 140.

The base layer 110 may provide a base surface at which the circuit layer 120 is located. The base layer 110 may be a rigid substrate or a flexible substrate capable of bending, folding, rolling, and the like. The base layer 110 may be a glass substrate, a metal substrate, a polymer substrate, or the like. However, the present disclosure is not limited thereto, and the base layer 110 may include an inorganic layer, an organic layer, or a composite material layer.

The base layer 110 may have a multilayer structure. For example, the base layer 110 may include a first synthetic resin layer, a multi-layered or single-layered inorganic layer, and a second synthetic resin layer located on the multi-layered or single-layered inorganic layer. Each of the first and second synthetic resin layers may include a polyimide-based resin, although the above is not particularly limited.

The circuit layer 120 may be located on the base layer 110. The circuit layer 120 may include an insulating layer, a semiconductor pattern, a conductive pattern, a signal line, etc. The circuit layer 120 may include a driving circuit of the pixel PX described with reference to FIG. 1.

The light-emitting element layer 130 may be located on the circuit layer 120. The light-emitting element layer 130 may include a light-emitting element of the pixel PX described with reference to FIG. 1. For example, the light-emitting element may include an organic light-emitting material, an inorganic light-emitting material, an organic-inorganic light-emitting material, a quantum dot, a quantum rod, a micro-LED, or a nano-LED.

The encapsulation layer 140 may be located on the light-emitting element layer 130. The encapsulation layer 140 may protect the light-emitting element layer 130 from foreign substances such as moisture, oxygen, and dust particles. The encapsulation layer 140 may include at least one inorganic layer. The encapsulation layer 140 may include a stacked structure of an inorganic layer/organic layer/inorganic layer.

The input sensing unit ISU may be located on the display panel DP. The input sensing unit ISU may sense an external input applied from the outside. The external input may be a user's input. The user's input may include various types of external inputs, such as a part of the user's body, light, heat, pen, or pressure.

The input sensing unit ISU may be formed on the display panel DP through a continuous process. In this case, in one or more embodiments, the input sensing unit ISU may be directly located on the display panel DP (e.g., a third component, such as an adhesive layer, may not be located between the input sensing unit ISU and the display panel DP).

The anti-reflection member RPP may be located on the input sensing unit ISU. The anti-reflection member RPP may reduce the reflectance of external light. The anti-reflection member RPP may be directly located on the input sensing unit ISU through a continuous process.

The anti-reflection member RPP may include a light blocking pattern that overlaps a reflective structure located under the anti-reflection member RPP. The anti-reflection member RPP may further include a color filter overlapping a light-emitting region to be described later. The color filter may include a first color filter, a second color filter, and a third color filter respectively corresponding to a first color pixel, a second color pixel, and a third color pixel.

The window member WM is located on the anti-reflection member RPP. The window member WM and the anti-reflection member RPP may be bonded by an adhesive layer AD. The adhesive layer may be a pressure sensitive adhesive film (PSA) or an optically clear adhesive (OCA) member.

The window member WM may include at least one base layer. The base layer may be a glass substrate or a synthetic resin film. The window member WM may have a multilayer structure. The window member WM may include a thin-film glass substrate and a synthetic resin film located on the thin-film glass substrate. The thin-film glass substrate and the synthetic resin film may be bonded by an adhesive layer, and the adhesive layer and the synthetic resin film may be separated from the thin-film glass substrate for the replacement thereof.

In one or more embodiments of the present disclosure, the adhesive layer AD may be omitted, and the window member WM may be located directly on the anti-reflection member RPP. An organic material, an inorganic material, or a ceramic material may be coated on the anti-reflection member RPP.

Figure 3:
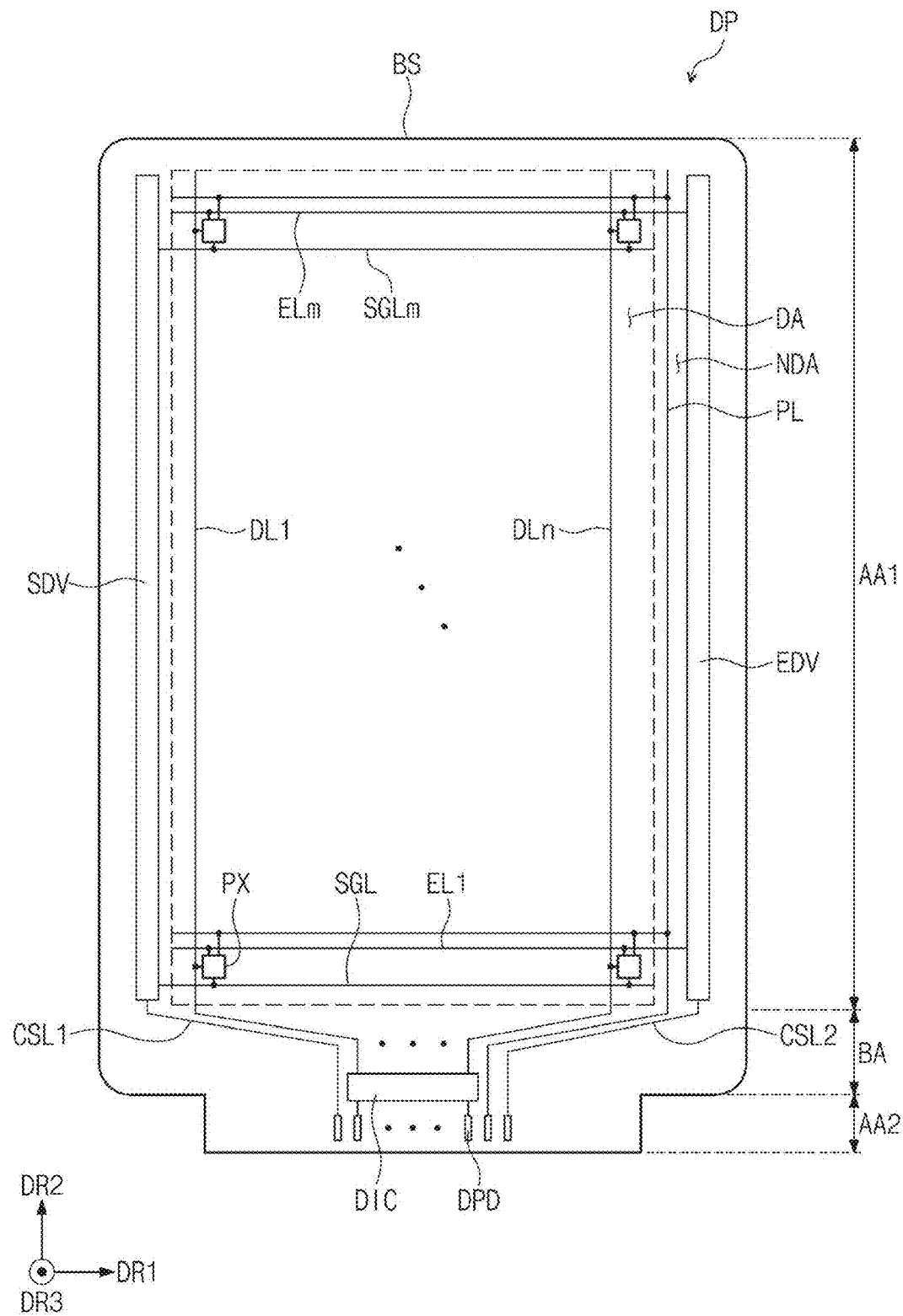
FIG. 3 is a plan view of a display panel according to one or more embodiments of the present disclosure.
Figure 4A:
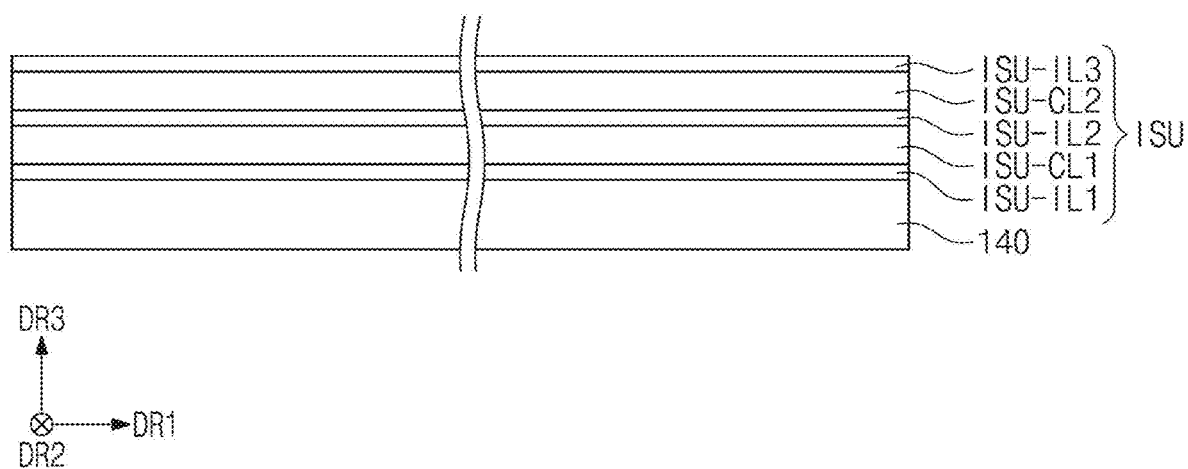
FIG. 4A is a cross-sectional view of an input sensing unit according to one or more embodiments of the present disclosure.
Figure 4B:
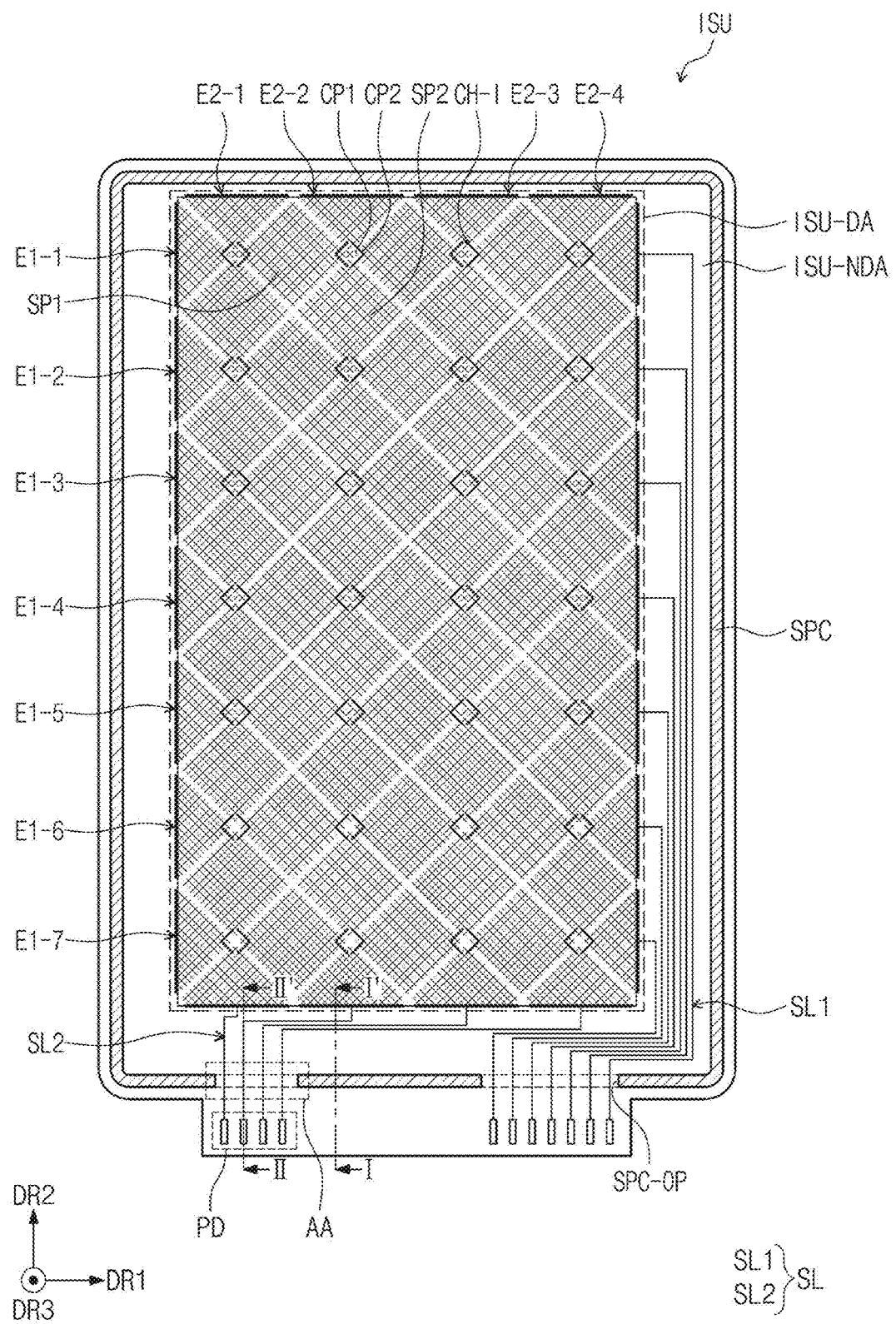
FIG. 4B is a plan view of an input sensing unit according to one or more embodiments of the present disclosure.

FIG. 3 is a plan view of a display panel according to one or more embodiments of the present disclosure. FIG. 4A is a cross-sectional view of an input sensing unit according to one or more embodiments of the present disclosure. FIG. 4B is a plan view of an input sensing unit according to one or more embodiments of the present disclosure. Hereinafter, the display module DM according to one or more embodiments of the present disclosure will be described with reference to FIGS. 3, 4A and 4B.

Referring to FIGS. 2, 3, 4A, and 4B together, the display module DM may include a display panel DP and an input sensing unit ISU. The display panel DP generates an image IM. In FIG. 3, a portion of the components of the display panel DP are illustrated in a plan view.

In FIG. 3, some components of the display panel DP are illustrated as block diagrams for convenience of explanation. Referring to FIG. 3, the display panel DP may include a base substrate BS, a scan driving circuit SDV, a light-emitting driving circuit EDV, a driving chip DIC, a plurality of panel signal lines SGL1 to SGLm, DL1 to DLn, EL1 to ELm, CSL1, CSL2, and PL, a plurality of pixels PX, and a plurality of display pads DPD.

The base substrate BS includes a first base region AA1, a second base region AA2, and a bending region BA, which are distinguished from each other in the second direction DR2. The second base region AA2 and the bending region BA may be a partial region of the non-display region NDA. The bending region BA is located between the first base region AA1 and the second base region AA2.

The first base region AA1 may be a region including the front surface IS in FIG. 1B. The second base region AA2 is spaced apart from the first base region AA1 with the bending region BA therebetween. The second base region AA2 and/or the base region BA may narrower in the first direction DR1 than the first base region AA1. That is, the total length of the bending region BA and the second base region AA2 in the first direction DR1 may be less than the length of the first base region AA1.

A region having a reduced length in the bending axis direction may be bent more easily. However, this is illustrated by way of example, and the second base region AA2 and the bending region BA may have the same width as the first base region AA1 in the second direction DR2, and the present disclosure is not limited to any one embodiment.

The bending region BA is bent with respect to a bending axis extending along the second direction DR2. When the bending region BA is not bent, the second base region AA2 and the first base region AA1 may be oriented in the same direction (e.g., while overlapping in the third direction DR3), and when the bending region BA is bent, the second base region AA2 may be oriented in a direction opposite to the first base region AA1.

The above-described circuit board MB (see FIG. 1B) is physically connected to the second base region AA2. As the bending region BA is bent, the circuit board MB is positioned on a rear surface of an electronic panel. Accordingly, a region defining the front surface IS becomes the first base region AA1, and the second base region AA2 and the bending region BA are not viewed through the front surface IS. Accordingly, a bezel area of the electronic device may be reduced.

Each of the pixels PX includes a light-emitting element, and a thin film transistor connected to the light-emitting element. The shape of the display panel DP illustrated in FIG. 3 is substantially the same as the planar shape of the above-described base layer. In one or more embodiments, a display region DA and a non-display region NDA may be partitioned according to a location of the light-emitting element(s).

FIG. 3 illustrates that the pixels PX are located in the display region DA. The display region DA may be a region in which the image IM is displayed. Meanwhile, this is illustrated by way of example, and a portion of the pixels PX may include a thin film transistor located in the non-display region NDA, and the present disclosure is not limited to any one embodiment.

The scan driving circuit SDV, the driving chip DIC, and the light-emitting driving circuit EDV may be located in the non-display region NDA. The driving chip DIC may include a data driving circuit.

The panel signal lines SGL1 to SGLm, DL1 to DLn, EL1 to ELm, CSL1, CSL2, and PL may include a plurality of scan lines SGL1 to SGLm, a plurality of data lines DL1 to DLn, a plurality of light-emitting lines EL1 to ELm, first and second control lines CSL1 and CSL2, and a power line PL. A plurality of display pads DPD may be respectively connected to the data lines DL1 to DLn, the first and second control lines CSL1 and CSL2, and the power line PL among the panel signal lines SGL1 to SGLm, DL1 to DLn, EL1 to ELm, CSL1, CSL2, and PL. Here, m and n are natural numbers. The pixels PX may be connected to the scan lines SGL1 to SGLm, the data lines DL1 to DLn, and the light-emitting lines EL1 to ELm.

The scan lines SGL1 to SGLm may extend in the second direction DR2 to be connected to the scan driving circuit SDV. The data lines DL1 to DLn may extend in the second direction DR2, and may be connected to the driving chip DIC via the bending region BA. The light-emitting lines EL1 to ELm may extend in the first direction DR1 to be connected to the light-emitting driving circuit EDV.

The power line PL may include a portion extending in the second direction DR2, and a portion extending in the first direction DR1. The portion extending in the first direction DR1 and the portion extending in the second direction DR2 may be located on different layers. A portion of the power line PL extending in the second direction DR2 may extend to the second base region AA2 via the bending region BA. The power line PL may provide a first voltage to the pixels PX.

The first control line CSL1 may be connected to the scan driving circuit SDV, and may extend toward a lower end of the second base region AA2 via the bending region BA. The second control line CSL2 may be connected to the light-emitting driving circuit EDV, and may extend toward the lower end of the second base region AA2 via the bending region BA.

When seen in a plan view, the display pads DPD may be located adjacent to the lower end of the second base region AA2. The driving chip DIC, the power line PL, the first control line CSL1, and the second control line CSL2 may be connected to the display pads DPD. The circuit board MB may be electrically connected to the display pads DPD through an anisotropic conductive adhesive layer.

Referring to FIG. 4A, the input sensing unit ISU may include a first sensing insulating layer ISU-IL1 (or a base insulating layer), a first conductive pattern layer ISU-CL1, a second sensing insulating layer ISU-IL2 (or an intermediate insulating layer), a second conductive pattern layer ISU-CL2, and a third sensing insulating layer ISU-IL3 (or a cover insulating layer). The first sensing insulating layer ISU-IL1 may be directly located on the encapsulation layer 140.

In one or more embodiments of the present disclosure, the first sensing insulating layer ISU-IL1 and/or the third sensing insulating layer ISU-IL3 may be omitted. When the first sensing insulating layer ISU-IL1 is omitted, the first conductive pattern layer ISU-CL1 may be located on the uppermost insulating layer of the encapsulation layer 140. The third sensing insulating layer ISU-IL3 may be replaced with an adhesive layer, or with an insulating layer of the anti-reflection member RPP located on the input sensing unit ISU.

The first conductive pattern layer ISU-CL1 may include first conductive patterns, and the second conductive pattern layer ISU-CL2 may include second conductive patterns. Hereinafter, the first conductive pattern layer ISU-CL1 and the first conductive patterns are denoted as like reference numerals or symbols, and the second conductive pattern layer ISU-CL2 and the second conductive patterns are denoted as like reference numerals or symbols.

Each of the first conductive patterns ISU-CL1 and the second conductive patterns ISU-CL2 may have a single-layer structure, or a multilayer structure in which layers are stacked along the third direction DR3. The multilayered conductive pattern may include at least two among transparent conductive layers and metal layers. The multilayered conductive pattern may include metal layers containing different metals. The transparent conductive layers may include indium tin oxide (ITO), indium zinc oxide (IZO), zinc oxide (ZnO), indium tin zinc oxide (ITZO), PEDOT, metal nanowires, and graphene. The metal layers may include molybdenum, silver, titanium, copper, aluminum, and alloys thereof. A detailed description of the stacked structure of the first conductive pattern layer ISU-CL1 and the second conductive pattern layer ISU-CL2 will be described later.

In one or more embodiments, each of the first sensing insulating layer ISU-IL1 to the third sensing insulating layer ISU-IL3 may include an inorganic layer or an organic layer. In one or more embodiments, the first sensing insulating layer ISU-IL1 to the third sensing insulating layer ISU-IL3 may include an inorganic layer. The inorganic layer may include silicon oxide, silicon nitride, or silicon oxynitride.

In one or more embodiments of the present disclosure, at least one among the first sensing insulating layer ISU-IL1 to the third sensing insulating layer ISU-IL3 may be an organic layer. For example, the third sensing insulating layer ISU-IL3 may include an organic layer. The organic layer may include at least one of acrylic resin, methacrylic resin, polyisoprene, vinyl-based resin, epoxy-based resin, urethane-based resin, cellulose-based resin, siloxane-based resin, polyimide-based resin, polyamide-based resin, or perylene-based resin.

Referring to FIG. 4B, the input sensing unit ISU includes a sensing region ISU-DA, and a non-sensing region ISU-NDA adjacent to the sensing region ISU-DA. The sensing region ISU-DA and the non-sensing region ISU-NDA respectively correspond to a display region 100A and a peripheral region 100N illustrated in FIG. 1.

The input sensing unit ISU is located in the sensing region ISU-DA and includes first electrodes E1-1 to E1-7 and second electrodes E2-1 to E2-4 cross each other and are insulated from each other. The input sensing unit ISU includes signal lines SL located in the non-sensing region ISU-NDA. The signal lines SL include first group signal lines SL1 electrically connected to the first electrodes E1-1 to E1-7, and the second group signal lines SL2 electrically connected to the second electrodes E2-1 to E2-4. The first electrodes E1-1 to E1-7, the second electrodes E2-1 to E2-4, the first group signal lines SL1, and the second group signal lines SL2 may be defined by a combination of the first conductive patterns ISU-CL1 and the second conductive patterns ISU-CL2 described with reference to FIG. 4A.

Each of the first electrodes E1-1 to E1-7 and the second electrodes E2-1 to E2-4 may include a plurality of conductive lines crossing each other. The plurality of conductive lines may define a plurality of openings, and the first electrodes E1-1 to E1-7 and the second electrodes E2-1 to E2-4 may each have a mesh shape. Each of the plurality of openings may be defined to correspond to a light-emitting region of the display panel DP.

The first electrodes E1-1 to E1-7 and/or the second electrodes E2-1 to E2-4 may have an integral shape. In one or more embodiments, the first electrodes E1-1 to E1-7 having an integral shape are illustrated. The first electrodes E1-1 to E1-7 may include sensing electrodes SP1 and intermediate portions CP1. A portion of the above-described second conductive patterns ISU-CL2 may correspond to the first electrodes E1-1 to E1-7.

Each of the second electrodes E2-1 to E2-4 may include sensing electrodes SP2 and bridge patterns CP2 (or connection patterns). Two adjacent sensing electrodes SP2 may be connected to two bridge patterns CP2 through contact holes CH-I passing through the second insulating layer ISU-IL2, but the number of the bridge patterns is not limited. The portion of the above-described second conductive patterns ISU-CL2 may correspond to the sensing electrodes SP2. A portion of the above-described first conductive patterns ISU-CL1 may correspond to the bridge patterns CP2.

In one or more embodiments, it is described that the bridge patterns CP2 are formed from the first conductive patterns ISU-CL1 illustrated in FIG. 3, and that the first electrodes E1-1 to E1-7 and the sensing electrodes SP2 are formed from the second conductive patterns ISU-CL2, but the present disclosure is not limited thereto. In one or more embodiments, the first electrodes E1-1 to E1-7 and sensing electrodes SP2 may be formed from the first conductive patterns ISU-CL1 illustrated in FIG. 3, and bridge patterns CP2 may be formed from the second conductive patterns ISU-CL2.

One among the first group signal lines SL1 and the second group signal lines SL2 transfers a transmission signal for sensing an external input from an external circuit, and the other transfers, as a reception signal, a change in capacitance between the first electrodes E1-1 to E1-7 and the second electrodes E2-1 to E2-4 to an external circuit. Each of the first group signal lines SL1 and the second group signal lines SL2 is connected to the sensing pad PD, receives, from the sensing pad PD, a transmission signal transmitted from an external circuit, or transmits a change in capacitance between the first electrodes E1-1 to E1-7 and the second electrodes E2-1 to E2-4 to an external circuit through the sensing pad PD. When seen in a plan view, the sensing pads PD may be located at a portion corresponding to the lower portion of the second base region AA2 of the display panel DP. The circuit board MB may be electrically connected to the sensing pads PD through an anisotropic conductive adhesive layer.

The portion of the above-described second conductive patterns ISU-CL2 may correspond to the first group signal lines SL1 and the second group signal lines SL2. The first group signal lines SL1 and the second group signal lines SL2 have multilayer structures, and each include a first layer line formed from the above-described first conductive patterns ISU-CL1, and a second layer line formed from the above-described second conductive patterns ISU-CL2. In one or more embodiments, the first layer line and the second layer line may be connected through a contact hole penetrating the second insulating layer ISU-IL2.

Referring to FIGS. 3, 4A, and 4B together, the display device according to one or more embodiments further includes a spacer SPC overlapping the non-sensing region ISU-NDA. The spacer SPC is a component included in the display panel DP in consideration of the arrangement relationship, but for convenience of explanation, the arrangement relationship between spacer SPC and the components included in the input sensing unit ISU is illustrated in FIG. 4B. The spacer SPC may be located on the circuit layer 120 of the above-described display panel DP. As illustrated in FIG. 4B, the spacer SPC may overlap the non-sensing region ISU-NDA, and might not overlap the sensing region ISU-DA. The spacer SPC may be located on the non-display region NDA, and may be located to surround, or partially surround, the display region DA.

At least one opening SPC-OP is defined in the spacer SPC. The opening SPC-OP may be defined in an extended portion such that the signal line SL is connected to the sensing pad PD. That is, a portion of the signal line SL may be located in the opening SPC-OP of the spacer SPC. As illustrated in FIG. 4B, the opening SPC-OP of the spacer SPC may be defined to correspond to a portion in which each of the first group signal lines SL1 and the second group signal lines SL2 is located. A detailed description of the shape of the spacer SPC will be described later.

Figure 5A:
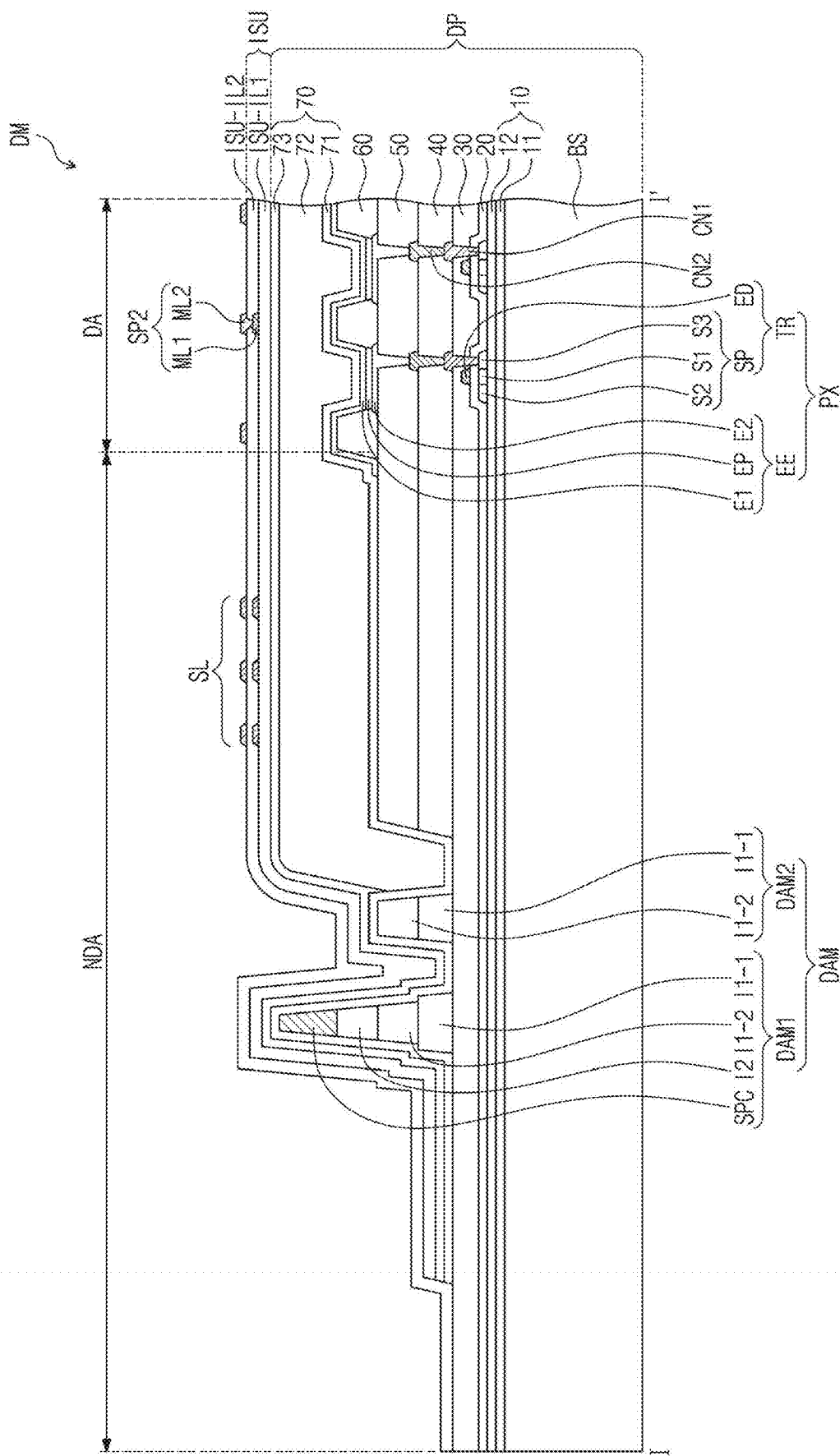
FIGS. 5A and 5B are each a cross-sectional view of a display module according to one or more embodiments of the present disclosure.
Figure 5B:
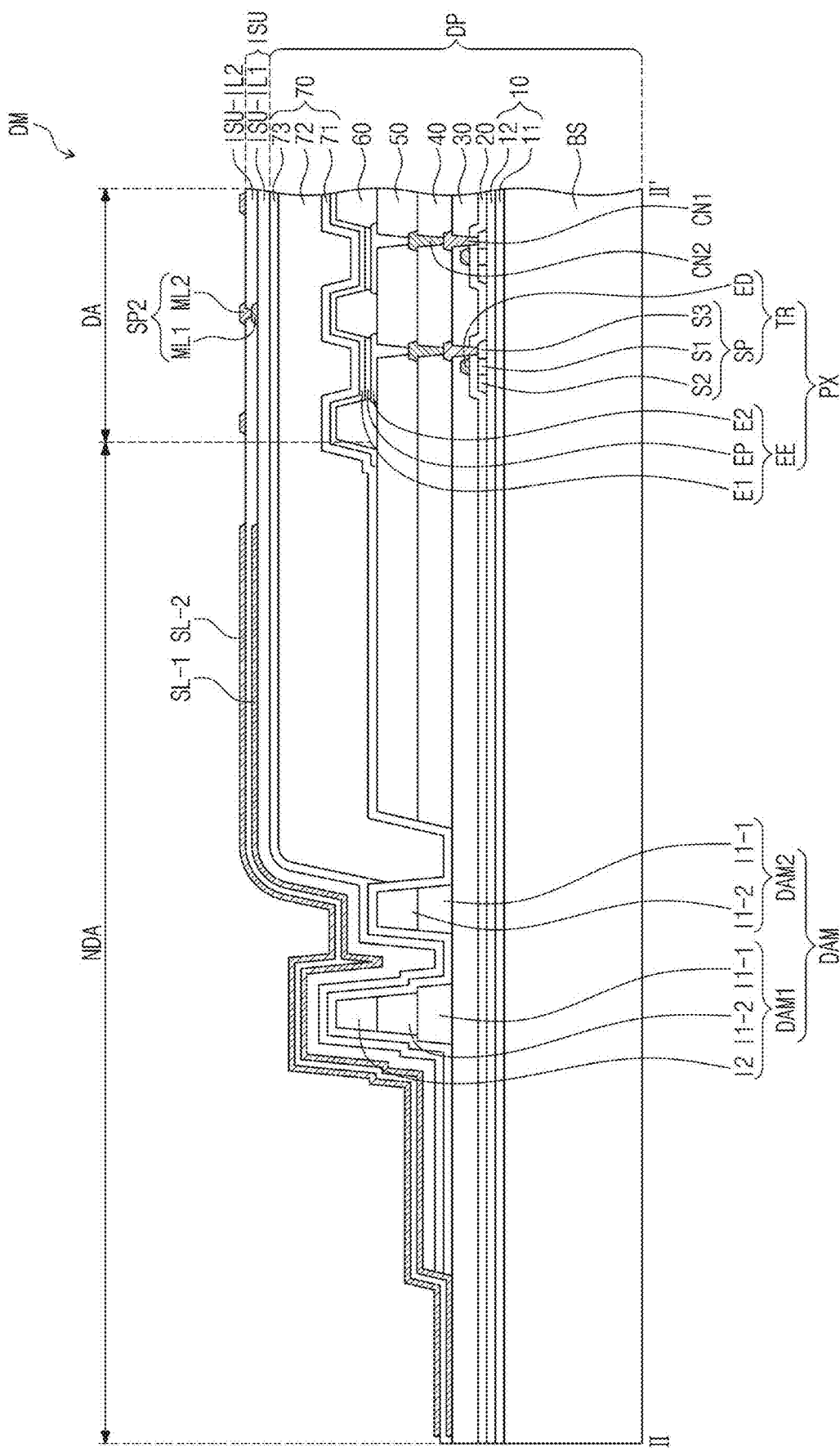

FIGS. 5A and 5B are each a cross-sectional view of a display module according to one or more embodiments of the present disclosure. FIG. 5A illustrates a cross-section taken along the line I-I' illustrated in FIG. 4. FIG. 5B illustrates a cross-section taken along the line II-II' illustrated in FIG. 4B.

As illustrated in FIGS. 5A and 5B, in the display module DM, the display panel DP and the input sensing unit ISU may be stacked. The display panel DP may include a base substrate BS, and a plurality of insulating layers 10, 20, 30, 40, 50, 60, and 70 located on the base substrate BS. Components constituting the above-described pixel PX, signal lines SGL1 to SGLm, DL1 to DLn, EL1 to ELm, CSL1, CSL2, and PL, and scan driving circuit SDV may be located between the base substrate BS and the insulating layers 10, 20, 30, 40, 50, 60, and 70.

The base substrate BS has insulating properties. The base substrate BS may have flexibility to be bendable. For example, the base substrate BS may be an insulating polymer film.

A first insulating layer 10 may be located on the base substrate BS. The first insulating layer 10 may include a barrier layer 11 and a buffer layer 12. The barrier layer 11 reduces or prevents foreign substances from being introduced from the outside. The barrier layer 11 may include at least one of a silicon oxide layer or a silicon nitride layer. Each of these layers may be provided in plurality, and silicon oxide layers and silicon nitride layers may be alternately stacked.

The buffer layer 12 may be located on the barrier layer 11. The buffer layer 12 improves the bonding force between the base substrate BS and the semiconductor pattern and/or the conductive pattern. The buffer layer 12 may include at least one of a silicon oxide layer or a silicon nitride layer. The silicon oxide layer and the silicon nitride layer may be alternately stacked.

The pixels PX are located on the first insulating layer 10. In FIGS. 4A and 4B, a partial component of one pixel PX is illustrated by way of example. The pixel PX may include a transistor TR and a light-emitting element EE.

The transistor TR may include a semiconductor pattern SP and a gate ED. The semiconductor pattern SP may be located on the first insulating layer 10. The semiconductor pattern SP may include a channel S1, a source S2, and a drain S3. The semiconductor pattern SP may include a silicon semiconductor, such as a single crystal silicon semiconductor, a polysilicon semiconductor, or an amorphous silicon semiconductor. Alternatively, the semiconductor pattern SP may include an oxide semiconductor. The semiconductor pattern SP according to one or more embodiments of the present disclosure may be formed of various materials as long as the semiconductor pattern has semiconductor properties, and is not limited to any one embodiment.

The semiconductor pattern SP has different electrical properties depending on whether the semiconductor pattern is doped or not. The semiconductor pattern may include a doped region and an undoped region. The doped region may be doped with an N-type dopant or a P-type dopant. A P-type transistor includes a doped region doped with a P-type dopant. The doped region has higher conductivity than the undoped region, and substantially serves as an electrode or signal wire. The undoped region substantially corresponds to the channel (or active portion) of the transistor. In other words, a portion of the first semiconductor pattern SP may be a channel S1 of the transistor TR, another portion may be a source S2 or drain S3 of the transistor TR, and still another portion may be a connection signal wire (or a connection electrode).

A second insulating layer 20 is located on the first insulating layer 10, and covers the semiconductor pattern SP. The second insulating layer 20 may be located between the semiconductor pattern SP and the gate ED of the transistor TR. The second insulating layer 20 may be an inorganic layer and/or an organic layer, and may have a single-layer or multilayer structure. The second insulating layer 20 may include at least one of aluminum oxide, titanium oxide, silicon oxide, silicon oxynitride, zirconium oxide, or hafnium oxide. In one or more embodiments, the second insulating layer 20 may be a single-layered silicon oxide layer. An inorganic layer to be described later may include at least one of the above-described materials.

The gate ED may be located on the second insulating layer 20. The gate ED may be a portion of the metal pattern. When seen in a plan view, the gate ED may overlap the channel S1. In the process of doping the semiconductor pattern, the gate ED may function as a mask.

A third insulating layer 30 may be located on the second insulating layer 20, and may cover the gate ED. The third insulating layer 30 may be an inorganic layer and may have a single-layer or multilayer structure. In one or more embodiments, the third insulating layer 30 may be a single-layered silicon oxide layer.

Meanwhile, as an example, and in the transistor TR, the source S2 or the drain S3 may be electrodes independently formed from the semiconductor pattern SP. In this case, the source S2 and the drain S3 may contact the semiconductor pattern SP, or may pass through the insulating layer to be connected to the semiconductor pattern SP. In addition, the gate ED may be located below the semiconductor pattern SP. The transistor TR according to one or more embodiments of the present disclosure may be formed to have various structures, and is not limited to any one embodiment.

A fourth insulating layer 40 may be located on the third insulating layer 30. The fourth insulating layer 40 may be an organic layer, and may have a single-layer or multilayer structure. For example, the fourth insulating layer 40 may be a single-layered polyimide-based resin layer. However, the present disclosure is not limited thereto, and the fourth insulating layer 40 may include at least one of acrylic resin, methacrylic resin, polyisoprene, vinyl-based resin, epoxy-based resin, urethane-based resin, cellulose-based resin, siloxane-based resin, polyamide-based resin, or perylene-based resin. An organic layer to be described later may include at least one of the above-described materials.

A first connection electrode CN1 may be located on the third insulating layer 30, and a second connection electrode CN2 may be located on the fourth insulating layer 40. The first connection electrode CN1 may pass through the second insulating layer 20 and the third insulating layer 30, and may be electrically connected to the semiconductor pattern SP. The second connection electrode CN2 may pass through the fourth insulating layer 40, and may be electrically connected to the first connection electrode CN1.

Meanwhile, at least one of the first connection electrode CN1 or the second connection electrode CN2 may be omitted. Alternatively, an additional connection electrode, which connects the light-emitting element EE and the transistor TR, may be further located. The electrical connection between the light-emitting element EE and the transistor TR may be variously changed according to the number of insulating layers located between the light-emitting element EE and the transistor TR, and the present disclosure is not limited thereto.

A fifth insulating layer 50 may be located on the fourth insulating layer 40, and may cover the second connection electrode CN2. The fifth insulating layer 50 may be an organic layer or an inorganic layer, and may have a single-layer or multilayer structure. Meanwhile, the first insulating layer 10 to the fifth insulating layer 50 among the plurality of insulating layers 10, 20, 30, 40, 50, 60, and 70, and the transistor TR are components corresponding to the above-described circuit layer 120 in FIG. 2.

The light-emitting element EE may be located on the fifth insulating layer 50. The light-emitting element EE may include a first electrode E1, a light-emitting layer EP, and a second electrode E2. The first electrode E1 may be electrically connected to the transistor TR through the first connection electrode CN1 and the second connection electrode CN2.

A sixth insulating layer 60 is located on the fifth insulating layer 50 and may expose at least a portion of the first electrode E1. The sixth insulating layer 60 may be a pixel defining film. The sixth insulating layer 60 (hereinafter, referred to as a pixel defining film) may be an inorganic layer, an organic layer, or a combination thereof, and may have a single-layer or multilayer structure. Meanwhile, in this specification, the sixth insulating layer 60 and the light-emitting element EE are components corresponding to the above-described light-emitting element layer 130 in FIG. 2.

The light-emitting layer EP may be located on the first electrode E1. The light-emitting layer EP may provide light of a color (e.g., predetermined color). Although the light-emitting layer EP of a patterned single layer is illustrated in one or more embodiments, the present disclosure is not limited thereto. For example, the light-emitting layer EP may have a multilayer structure. In addition, the light-emitting layer EP may extend toward the upper surface of the sixth insulating layer 60, and may be provided in common to the plurality of pixels.

The second electrode E2 may be located on the light-emitting layer EP. In one or more embodiments, an electron control layer (or an electron control region) may be located between the second electrode E2 and the light-emitting layer EP, and/or a hole control layer (or a hole control region) may be located between the first electrode E1 and the light-emitting layer EP.

A seventh insulating layer 70 is located on the sixth insulating layer 60 and covers the light-emitting element EE. The seventh insulating layer 70 may be a component corresponding to the encapsulation layer that has been described with reference to FIG. 2. The seventh insulating layer 70 (hereinafter, referred to as an encapsulation layer) may include a first inorganic layer 71, an organic layer 72, and a second inorganic layer 73.

The first inorganic layer 71 may be located on the second electrode E2. The organic layer 72 may be located on the first inorganic layer 71. The second inorganic layer 73 may be located on the organic layer 72, and may cover the organic layer 72. The first inorganic layer 71 and the second inorganic layer 73 may include a silicon nitride layer, a silicon oxynitride layer, a silicon oxide layer, a titanium oxide layer, an aluminum oxide layer, or the like, and are not particularly limited thereto. The organic layer 72 may include an acryl-based organic layer, and is not particularly limited. The first inorganic layer 71 and the second inorganic layer 73 may protect the light-emitting element EE from moisture/oxygen or foreign substances.

The display panel DP further includes a dam DAM located in the non-display region NDA. The dam DAM is located outside the display module DM to reduce or prevent the likelihood of overflow of the organic layer 72.

The dam DAM may be provided in plurality. The dam DAM may include a first dam DAM1 and a second dam DAM2. The first dam DAM1 and the second dam DAM2 are arranged in an order along a direction approaching the display region DA. That is, the first dam DAM1 is located to be spaced apart from the display region DA compared to the second dam DAM2, and the second dam DAM2 may be located between a region in which the first dam DAM1 is located and the display region DA.

The dams DAM1 and DAM2 may each include a plurality of layers. In one or more embodiments, the first dam DAM1 may include a (1-1)-st layer I1-1, a (1-2)-nd layer I1-2, and a second layer I2. The second dam DAM2 may include a (1-1)-st layer I1-1 and a (1-2)-nd layer I1-2. The first dam DAM1 may have a greater height than the second dam DAM2. The (1-1)-st layer I1-1 and the (1-2)-nd layer I1-2 may respectively correspond to the fourth insulating layer 40 and the fifth insulating layer 50. That is, the (1-1)-st layer I1-1 and the fourth insulating layer 40 may include the same material, and may be formed through the same process. The (1-2)-nd layer I1-2 and the fifth insulating layer 50 may include the same material and may be formed through the same process. The second layer I2 may be a layer corresponding to the sixth insulating layer 60, that is, a pixel defining film. The second layer I2 and the sixth insulating layer 60 may include the same material, and may be formed through the same process.

In the first dam DAM1 located outside, the above-described spacer SPC may be located on the second layer I2. The spacer SPC may be located on the top of the first dam DAM1, and thus may increase the height of the first dam DAM1 to reduce or prevent the likelihood of overflow of the organic layer 72, and furthermore may ensure a gap between the metal mask and an underlying component when the metal mask is located on an upper portion of the display module DM in a post process, thereby reducing or preventing the likelihood of the underlying component being dented caused by the metal mask.

The input sensing unit ISU may be located on the display panel DP. The input sensing unit ISU may include a first conductive layer ML1, a second conductive layer ML2, a first sensing insulating layer ISU-IL1, and a second sensing insulating layer ISU-IL2. The second conductive layer ML2 is located on a different layer from the first conductive layer ML1, and is located on the second sensing insulating layer ISU-IL2. The second sensing insulating layer ISU-IL2 is located on the first sensing insulating layer ISU-IL1, and covers the first conductive layer ML1. Meanwhile, the third sensing insulating layer ISU-IL3 that has been described with reference to FIG. 4A may be located on the second conductive layer ML2.

At least one of the first conductive layer ML1 or the second conductive layer ML2 constitutes the sensing electrode SP2. In one or more embodiments, it is illustrated that the sensing electrode SP2 may have a mesh-shaped pattern as described above, and may include a first conductive layer ML1, and may include a second conductive layer ML2 that is connected to the first conductive layer ML1. However, this is illustrated by way of example, and the sensing electrode SP2 may be a portion of any one of the first conductive layer ML1 and the second conductive layer ML2. Alternatively, the sensing electrode SP2 may be a single-shaped pattern overlapping the plurality of light-emitting elements. In addition, the first conductive layer ML1 or the second conductive layer ML2 may include a transparent conductive oxide or an opaque metal, but is not limited to any one embodiment.

Portions of the first conductive layer ML1 and the second conductive layer ML2 may be signal lines SL. That is, in one or more embodiments, it is illustrated that the signal lines SL include a plurality of layers located on the first sensing insulating layer ISU-IL1 and the second sensing insulating layer ISU-IL2. As illustrated in FIGS. 5A and 5B, the signal lines SL may have a double layer structure including a first signal line SL-1 located on the first sensing insulating layer ISU-IL1, and a second signal line SL-2 located on the second sensing insulating layer ISU-IL2. However, this is merely an example, and at least a portion of the signal lines SL may correspond to only one of the first conductive layer ML1 and the second conductive layer ML2, and the present disclosure is not limited to any one embodiment. Portions of the first signal line SL-1 and the second signal line SL-2 may be connected to each other through a contact hole defined in the second sensing insulating layer ISU-IL2. Meanwhile, in one or more embodiments, the sensing pad PD (see FIG. 4B) may be located at the ends of the signal lines SL-1 and SL-2 illustrated in FIG. 5B, and may be electrically connected to the signal lines SL-1 and SL-2. The sensing pad PD (see FIG. 4B) may be located on the third sensing insulating layer ISU-IL3 and may be connected to the signal lines SL-1 and SL-2 through a contact hole defined in the third sensing insulating layer.

Referring to FIGS. 4B, 5A, and 5B together, a spacer SPC is located in the first dam DAM1, as seen in a cross-section taken along the line I-I' in FIG. 4B (e.g., FIG. 5A), and is a portion not corresponding to a path in which the signal line SL is connected to the sensing pad PD. Further, a spacer SPC is not located in the first dam DAM1, as seen in a cross-section which is taken along the line II-II' in FIG. 4B (e.g., FIG. 5B), and is a portion corresponding to the path in which the signal line SL is connected to the sensing pad PD. That is, the spacer SPC located on the uppermost layer of the first dam DAM1 is located to surround the sensing region ISU-DA in a portion that is other than the path in which the signal line SL is connected to the sensing pad PD. Also, the opening SPC-OP overlapping the path in which the signal line SL is connected to the sensing pad PD is defined so that the spacer SPC is not located in the first dam DAM1. Meanwhile, in one or more embodiments, in the cross-section taken along the line II-II' of the first dam DAM1 in FIG. 4B, and in a portion corresponding to the path in which the signal line SL is connected to the sensing pad PD, not only the spacer SPC, but also at least one layer of the (1-1)-st layer I1-1, the (1-2)-nd layer I1-2, or the second layer I2 located therebelow, may be omitted. For example, either of the (1-1)-st layer I1-1 or the (1-2)-nd layer I1-2, which correspond to the fourth insulating layer 40 or the fifth insulating layer 50, may be omitted. Alternatively, the second layer I2, which is a layer corresponding to the pixel defining film that is the sixth insulating layer 60, may be omitted.

In the display module included in the display device according to one or more embodiments, the spacer is located on the upper portion of the dam for controlling the flow of the organic layer, and for reducing or preventing the likelihood of the mask being dented. The spacer does not overlap a path through which the signal line of the input sensing unit passes, and is omitted therefrom (e.g., defines an opening thereat). The spacer has a shape surrounding the display region of the display panel and the sensing region of the input sensing unit. However, an opening is defined in a portion overlapping the path through which the signal line of the input sensing unit passes, and thus the spacer may not overlap the path through which the signal line passes. Accordingly, the height of the dam may be lowered in the path through which the signal line passes, and the likelihood of the signal line being thinned in a signal line patterning process may be reduced or prevented.

For example, when the spacer overlaps the portion overlapping the path through which the signal line of the input sensing unit passes to result in an increase in the height of the dam, a large stepped portion is formed, so that the difference in exposure amount between a portion of the signal line that overlaps the dam, and a portion of the signal line that does not overlap the dam, becomes large. In addition, a relatively large amount of light is irradiated to a portion overlapping the dam, so that the thickness of the wire may be reduced, and accordingly, defects such as disconnection may occur. In addition, when the stepped portion is large, a short circuit may occur due to overlap between the wires. In the present disclosure, the difference in exposure amount may be reduced by lowering the height of the dam by not having the spacer overlap the path through which the signal line passes. Accordingly, it is possible to reduce or prevent the likelihood of the signal line being thinned, and it is possible to improve the reliability of the display module.

Figure 6A:
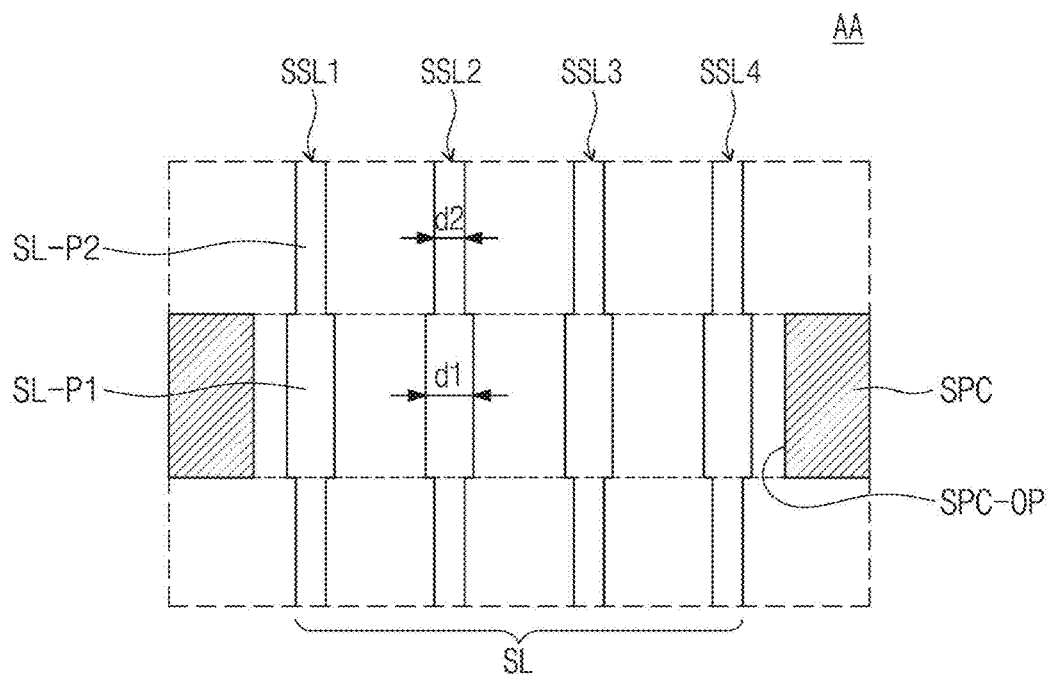
FIGS. 6A and 6B are each a plan view of a portion of an input sensing unit according to one or more embodiments of the present disclosure.
Figure 6B:
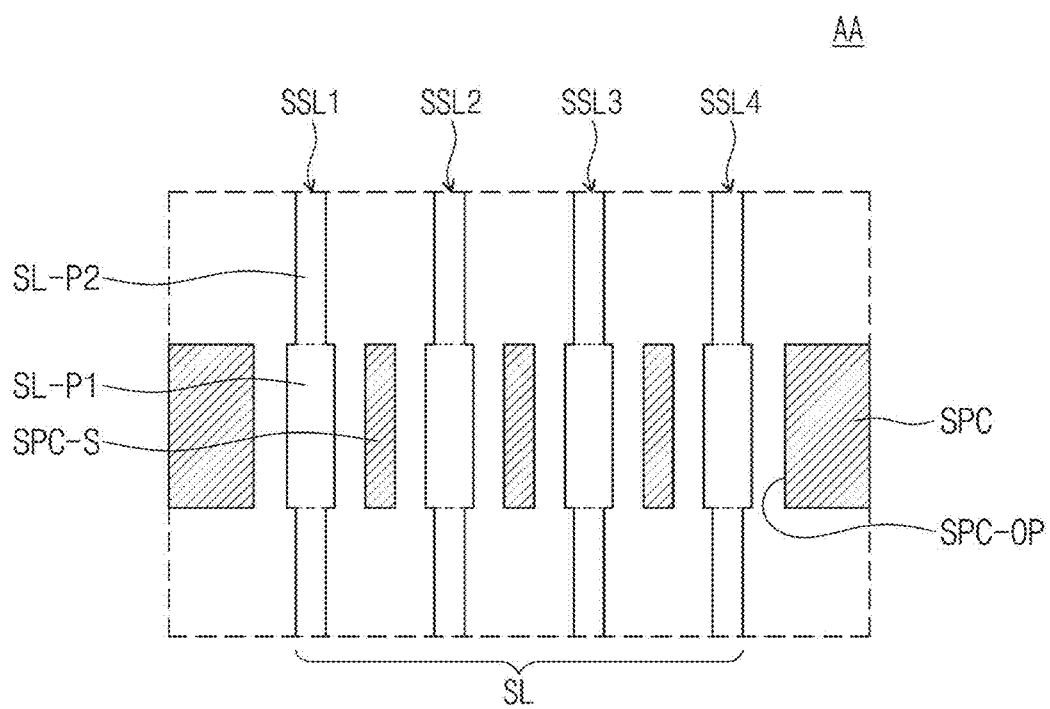

FIGS. 6A and 6B are each a plan view of a portion of an input sensing unit according to one or more embodiments of the present disclosure. In FIGS. 6A and 6B, the region AA illustrated in FIG. 4B is enlarged.

Referring to FIGS. 6A and 6B, the signal lines SL may include a plurality of sub-signal lines SSL1, SSL2, SSL3, and SSL4, and a portion of each of the sub signal lines SSL1, SSL2, SSL3, and SSL4 may be located inside the opening SPC-OP defined in the spacer SPC.

Each of the signal lines SL includes a first portion (e.g., a first line portion) SL-P1 located inside the opening SPC-OP, and a second portion (e.g., a second line portion) SL-P2 adjacent thereto and not located in the opening SPC-OP. The first portion SL-P1 and the second portion SL-P2 may have an integral shape, and may be formed through the same process.

The first portion SL-P1 and the second portion SL-P2 have different widths. In one or more embodiments, the width d1 of the first portion SL-P1 is greater than the width d2 of the second portion SL-P2. The first portion SL-P1 and the second portion SL-P2 are formed through the same process, but may be formed by adjusting process conditions such that the first portion SL-P1 has a larger width in the forming process.

Because in the display module included in the display device according to one or more embodiments, the first portion of the signal line located inside the opening of the spacer has a greater width than a portion adjacent thereto, it is possible to reduce or prevent the likelihood of the signal line being disconnected in a signal line patterning process. For example, because the portion in which the opening of the spacer is defined is the portion in which the above-described dam is located, the signal line is located higher than a portion adjacent thereto, and a relatively large amount of light is irradiated during exposure to cause wire thinning and resulting wire disconnection. However, in the display module according to one or more embodiments, the first portion of the signal line located inside the opening is formed to have a greater width, thereby preventing or reducing wire thinning caused by exposure and resulting wire disconnection. Accordingly, the reliability of the display module may be improved.

Referring to FIG. 6B, the spacer SPC may include a plurality of sub-spacers SPC-S located between the plurality of sub signal lines SSL1, SSL2, SSL3, and SSL4. As the spacer SPC is patterned, the sub-spacers SPC-S may be located apart from the plurality of sub-signal lines SSL1, SSL2, SSL3, and SSL4 between the plurality of sub-signal lines SSL1, SSL2, SSL3, and SSL4. As the spacer SPC includes the plurality of sub-spacers SPC-S, the spacer SPC and the signal lines SL do not overlap, and thus prevent or reduce the likelihood of the signal line being thinned. In addition, the portion in which the spacer SPC is omitted is reduced or minimized, thereby making it possible to effectively perform the function of controlling the flow of the organic encapsulation layer, and reducing or preventing the likelihood of the mask being dented.

Figure 7A:
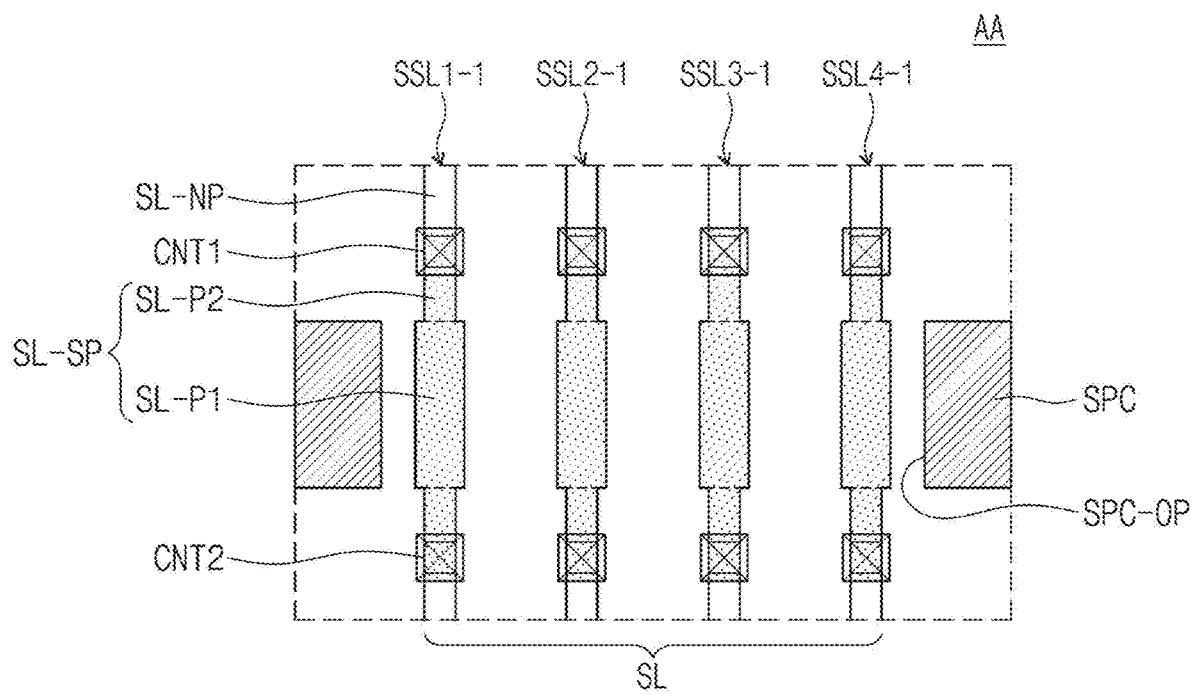
FIG. 7A is a plan view of a portion of an input sensing unit according to one or more embodiments of the present disclosure.
Figure 7B:
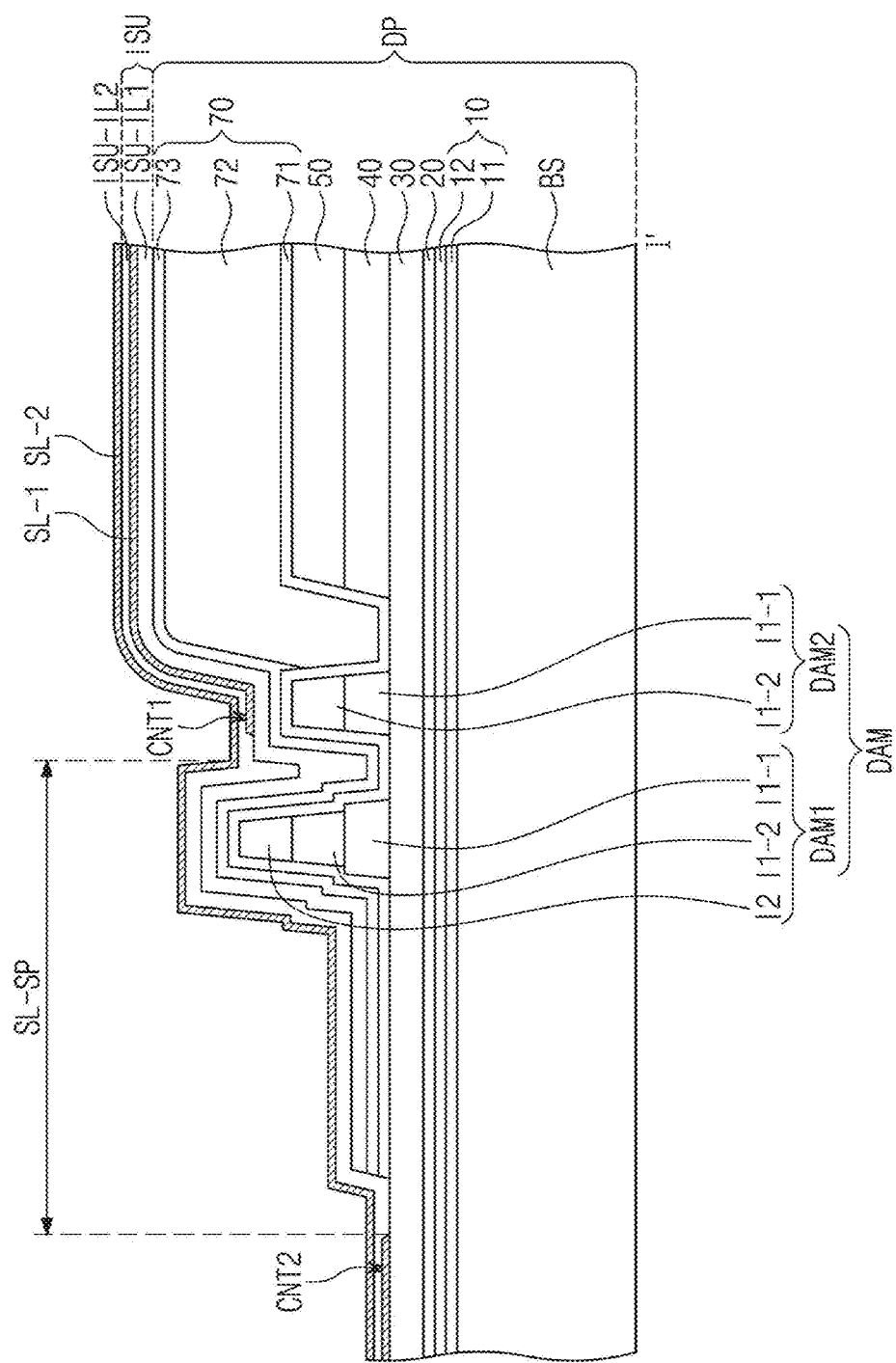
FIGS. 7B and 7C are each a cross-sectional view of a portion of a display module according to one or more embodiments of the present disclosure.
Figure 7C:
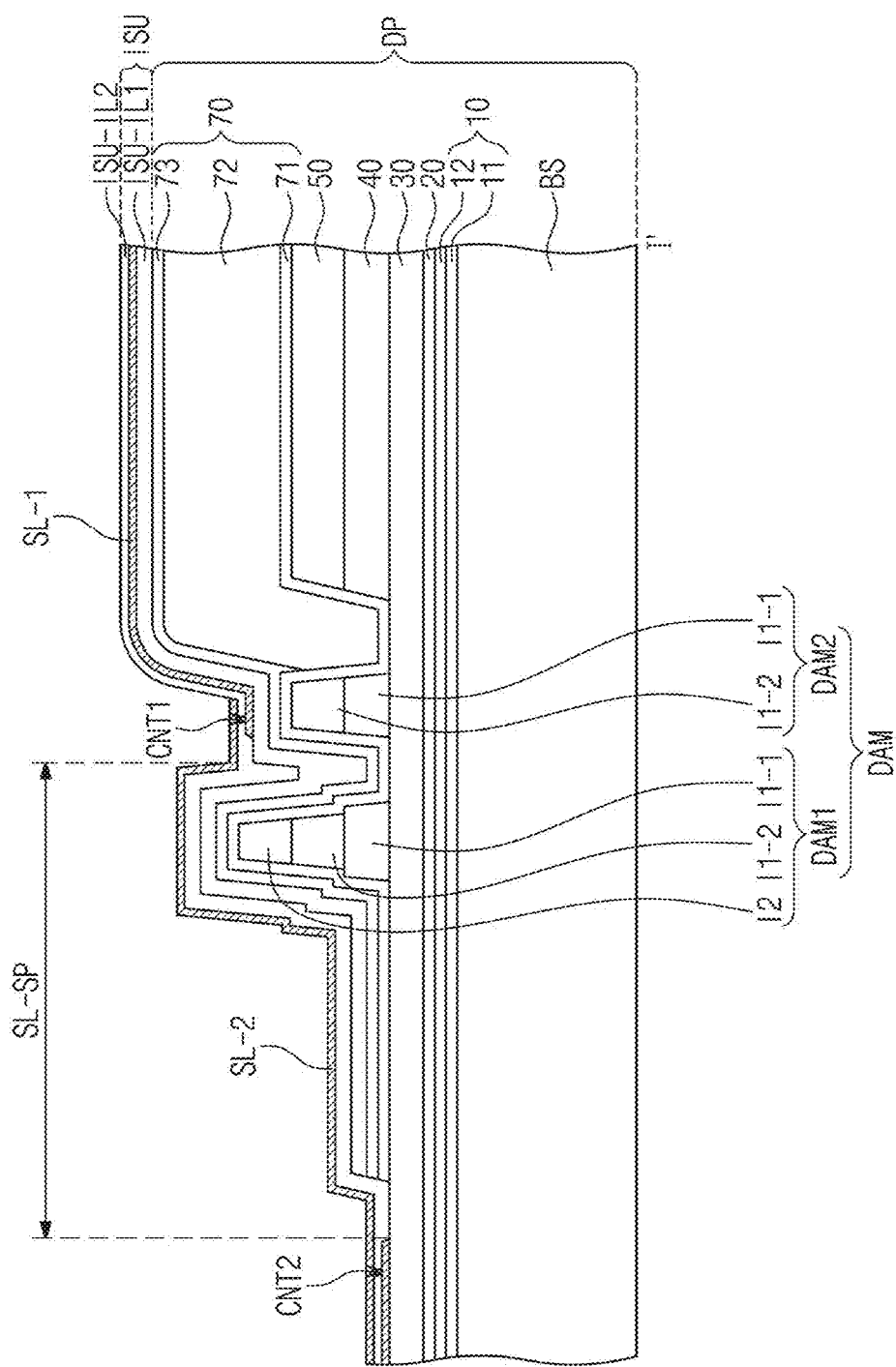

FIG. 7A is a plan view of a portion of an input sensing unit according to one or more embodiments of the present disclosure. FIGS. 7B and 7C are each a cross-sectional view of a portion of a display module according to one or more embodiments of the present disclosure. FIGS. 7B and 7C illustrate an enlarged cross section of the display module corresponding to the planar portion illustrated in FIG. 7A is enlarged. Hereinafter, the same reference numerals or symbols are given to the components described above in FIGS. 4A to 6B, and a detailed description thereof will be omitted.

Referring to FIG. 7A, the signal lines SL may include a plurality of sub signal lines SSL1-1, SSL2-1, SSL3-1, and SSL4-1 partially located in the opening SPC-OP, and each of the plurality of sub signal lines SSL1-1, SSL2-1, SSL3-1, and SSL4-1 may include an inner signal line SL-SP and an outer signal line SL-NP. The inner signal line SL-SP and the outer signal line SL-NP may be connected to each other through the contact holes CNT1 and CNT2. The inner signal line SL-SP may include the first portion SL-P1 that is located inside the opening SPC-OP of the spacer SPC, and the second portion SL-P2 that is adjacent to the first portion SL-P1, and the width of the first portion SL-P1 may be greater than that of the second portion SL-P2. The first portion SL-P1 and the second portion SL-P2 may have an integral shape, and may be formed through the same process.

Referring to FIGS. 7A and 7B together, some of the signal lines SL provided as a double-layer structure may have a structure in which the first signal line SL-1 is omitted, and in which only the second signal line SL-2 is located. For example, the second signal line SL-2 may be located in a portion in which the first dam DAM1 is located, and the first signal line SL-1 may be omitted in a portion overlapping the first dam DAM1. That is, the first signal line SL-1 might not be located in the opening SPC-OP of the spacer SPC illustrated in FIG. 7A.

The first signal line SL-1 may include a (1-1)-st signal line having one end connected to the second signal line SL-2 through the first contact hole CNT1, and having another end connected to sensing electrodes SP1 and SP2 (see FIG. 4B), and may include a (1-2)-nd signal line having one end connected to the second signal line SL-2 through the second contact hole CNT2, and the other end connected to the sensing pad PD (see FIG. 4B).

Referring to FIGS. 7A to 7C, the second signal line SL-2 may overlap a portion of the inner signal line SL-SP, which the first dam DAM1 overlaps, and which the first signal line SL-1 might not overlap. A first signal line SL-1 overlaps a portion of the outer signal line SL-NP other than the portion of the inner signal line SL-SP. The second signal line SL-2 may overlap a portion of the outer signal line SL-NP, or may be omitted. As illustrated in FIGS. 7A and 7B, the second signal line SL-2 may overlap a portion of the outer signal line SL-NP. In this case, the second signal line SL-2 may be provided to overlap the entire signal line SL. Alternatively, as illustrated in FIGS. 7A and 7C, the second signal line SL-2 is provided so as not to overlap the portion of outer signal line SL-NP, so that the portion of the outer signal line SL-NP may have a single-layered wire structure composed of only the first signal line SL-1.

In the display module included in the display device according to one or more embodiments, the inner signal line portion located inside the opening of the spacer among the signal lines has a structure in which the first signal line is omitted, and only the second signal line is included, thereby reducing or preventing the likelihood of a defect in which the signal line is thinned in a signal line patterning process. For example, because the portion in which the opening of the spacer is defined is the portion in which the above-described dam is located, the signal line is at a greater height than portions adjacent thereto, and a relatively large amount of light may be irradiated during exposure, thereby causing wire thinning and short-circuit. However, in the display module according to one or more embodiments, the first signal line, which is the lower layer wire, is omitted from the inner signal line portion, an additional stepped portion resulting from the wire may be reduced, thereby reducing or preventing wire thinning and short-circuit caused by exposure. Accordingly, the reliability of the display module may be improved.

According to a display device according to one or more embodiments of the present disclosure, it is possible to reduce or prevent the likelihood of a defect in which the signal line of the input sensing unit is thinned. Accordingly, the reliability of the display device may be improved.

Although embodiments of the present disclosure have been described, it is understood that the present disclosure should not be limited to these embodiments, but various changes and modifications can be made by one ordinary skilled in the art within the spirit and scope of the present disclosure as hereinafter claimed.

What is claimed is:

1. A display device comprising:
   a display panel comprising a display region and a non-display region; and
   an input sensing unit comprising:
   a sensing pad in a pad region overlapping the non-display region;
   a sensing electrode overlapping the display region; and
   a signal line electrically connecting the sensing pad and the sensing electrode,
   wherein the display panel has a spacer surrounding the display region in a plan view, and defining an opening in which a first portion of the signal line is located, the first portion of the signal line having a greater width than a second portion that is not located in the opening defined by the spacer.

2. The display device of claim 1, wherein the spacer does not overlap the signal line.

3. The display device of claim 2, wherein the signal line comprises sub-signal lines in the opening defined by the spacer, and
   wherein the spacer comprises sub-spacers respectively between the sub-signal lines.

4. The display device of claim 1, wherein the display panel comprises
   a base layer,
   a circuit layer on the base layer, and comprising insulating layers, and
   a light-emitting element layer on the circuit layer, and comprising a pixel defining film and a light-emitting element,
   wherein the spacer is on the pixel defining film.

5. The display device of claim 4, wherein a portion of the insulating layers that overlaps the first portion of the signal line is thinner than another portion of the insulating layers that does not overlap the first portion of the signal line.

6. The display device of claim 4, wherein the display panel further comprises a dam in the non-display region and comprising a stack of materials that are respectively the same as at least one of the insulating layers, the pixel defining film, and the spacer.

7. The display device of claim 6, wherein the dam comprises a first dam, and a second dam that is closer to the display region than the first dam.

8. The display device of claim 6, wherein the pixel defining film does not overlap the first portion of the signal line.

9. The display device of claim 6, wherein the dam comprises:
a first layer comprising a same material as the at least one of the insulating layers;
a second layer comprising a same material as the pixel defining film; and
a third layer comprising a same material as the spacer.

10. The display device of claim 1, wherein the input sensing unit comprises:
a first sensing insulating layer directly on the display panel;
a first conductive layer on the first sensing insulating layer;
a second sensing insulating layer on the first conductive layer;
a second conductive layer on the second sensing insulating layer; and
a third sensing insulating layer on the second conductive layer.

11. The display device of claim 10, wherein the signal line comprises a first signal line on the first sensing insulating layer, and a second signal line on the second sensing insulating layer.

12. The display device of claim 11, wherein the second signal line overlaps the first portion of the signal line, and the first signal line does not overlap the first portion of the signal line.

13. The display device of claim 12, wherein the first signal line comprises:
a first-sub signal line having one end connected to the sensing electrode, and connected to the second signal line through a first contact hole; and
a second sub signal line having one end connected to the sensing pad, and connected to the second signal line through a second contact hole.

14. The display device of claim 1, wherein the second portion is electrically connected to the first portion.

15. A display device comprising:
a display panel comprising a display region and a non-display region; and
an input sensing unit comprising:
a sensing pad in a pad region overlapping the non-display region;
a sensing electrode overlapping the display region; and
a signal line electrically connecting the sensing pad and the sensing electrode,
wherein the display panel comprises a dam surrounding the display region in a plan view, and comprising a first portion overlapping the signal line, and a second portion not overlapping the signal line,
wherein a height of the first portion is less than a height of the second portion, and
wherein a first line portion of the signal line overlapping the first portion has a greater width than a second line portion that is not overlapping the first portion.

16. A display device comprising:
a display panel comprising a display region and a non-display region; and
an input sensing unit comprising:
a sensing pad in a pad region overlapping the non-display region;
a sensing electrode overlapping the display region; and
a signal line electrically connecting the sensing pad and the sensing electrode,
wherein the display panel comprises a base layer,
a circuit layer on the base layer, and comprising insulating layers,
a light-emitting element layer on the circuit layer, and comprising a pixel defining film and a light-emitting element,
a dam having a first portion overlapping the signal line, and a second portion not overlapping the signal line, and
a spacer on the pixel defining film,
wherein the first portion of the dam comprises a first layer comprising a same material as at least one of the insulating layers, a second layer comprising a same material as the pixel defining film, and a third layer comprising a same material as the spacer,
wherein the second portion of the dam comprises a first layer comprising the same material as the at least one of the insulating layers and a second layer comprising the same material as the pixel defining film,
wherein the second portion of the dam does not include a third layer comprising the same material as the spacer, and
wherein a first line portion of the signal line overlapping the first portion has a greater width than a second line portion adjacent to the first line portion.

* * * * *